(12) United States Patent
Wang et al.

(10) Patent No.: US 9,257,578 B2
(45) Date of Patent: Feb. 9, 2016

(54) INORGANIC REACTION SYSTEM FOR ELECTROCONDUCTIVE PASTE COMPOSITION

(71) Applicant: Heraeus Precious Metals North America Conshohocken LLC, West Conshohocken, PA (US)

(72) Inventors: Lei Wang, Conshohocken, PA (US); Li Yan, West Conshohocken, PA (US); Cuiwen Guo, Horsham, PA (US); Weiming Zhang, Blue Bell, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 204 days.

(21) Appl. No.: 13/864,499

(22) Filed: Apr. 17, 2013

(65) Prior Publication Data

US 2013/0270489 A1    Oct. 17, 2013

Related U.S. Application Data

(60) Provisional application No. 61/625,383, filed on Apr. 17, 2012, provisional application No. 61/684,884, filed on Aug. 20, 2012.

(51) Int. Cl.
*H01M 4/88* (2006.01)
*H01L 31/0224* (2006.01)
(Continued)

(52) U.S. Cl.
CPC .......... *H01L 31/022425* (2013.01); *C03C 8/10* (2013.01); *C03C 8/16* (2013.01);
(Continued)

(58) Field of Classification Search
CPC ................ H01L 31/0264; H01L 31/02242
USPC .............. 252/182.1, 500; 136/256, 252
See application file for complete search history.

(56) References Cited

U.S. PATENT DOCUMENTS 4,945,071 A    7/1990  Friesen et al.
6,071,437 A    6/2000  Oya
(Continued)

FOREIGN PATENT DOCUMENTS

EP    1 713 092 A2    10/2006
EP    2 317 561 A2    5/2011
(Continued)

OTHER PUBLICATIONS

G El-Damrawi: "Silver ion transporting mechanism in superionic conducting AgI—Ag2O—TeO2 glasses", J. Phys., Condens. Matter 11 (1999) 6385-6394.*

(Continued)

*Primary Examiner* — Khanh Tuan Nguyen
(74) *Attorney, Agent, or Firm* — Blank Rome LLP

(57) ABSTRACT

The invention provides an inorganic reaction system for the preparation of electroconductive paste. Particularly, an inorganic reaction system comprises conductive glass. The inorganic reaction system may comprise a silver containing matrix forming composition. The silver containing matrix composition may comprise at least one of silver oxide or silver halide, or both. The invention also provides solar cells manufactured utilizing an electroconductive paste comprising an inorganic reaction system comprising conductive glass, and methods of manufacturing solar cells utilizing an electroconductive paste comprising an inorganic reaction system comprising conductive glass.

22 Claims, 4 Drawing Sheets

(51) Int. Cl.
  *H01L 31/0264* (2006.01)
  *H01B 1/16* (2006.01)
  *C03C 8/10* (2006.01)
  *C03C 8/16* (2006.01)
  *C03C 8/18* (2006.01)
  *C03C 3/12* (2006.01)
  *H01B 1/22* (2006.01)

(52) U.S. Cl.
  CPC . *C03C 8/18* (2013.01); *H01B 1/16* (2013.01); *H01L 31/0264* (2013.01); *C03C 3/12* (2013.01); *H01B 1/22* (2013.01); *Y02E 10/50* (2013.01)

(56) References Cited

U.S. PATENT DOCUMENTS

| | | | |
|---|---|---|---|
| 2010/0126565 A1* | 5/2010 | Takeda et al. | 136/252 |
| 2011/0094578 A1* | 4/2011 | Akimoto et al. | 136/256 |
| 2011/0232746 A1 | 9/2011 | Carroll et al. | |
| 2012/0031484 A1 | 2/2012 | Matsuno et al. | |

FOREIGN PATENT DOCUMENTS

| | | | |
|---|---|---|---|
| EP | 2317523 A1 | 5/2011 | |
| EP | 2 590 177 A2 | 5/2013 | |
| JP | H05 128910 A | 5/1993 | |
| JP | 2004-331416 | * 11/2004 | C03C 4/14 |
| JP | 2008 251324 A | 10/2008 | |
| JP | 2011 082211 A | 4/2011 | |
| WO | 92/00925 A1 | 1/1992 | |
| WO | 2011/060341 A1 | 5/2011 | |

OTHER PUBLICATIONS

A.M. Zahra et al., "New Silver Tellurite Glasses", Journal of Thermal Analysis, vol. 38 (1992) 749-760.*

Chowdari, B.V.R et al: "Synthesis and characterization of silver borotellurite glasses", Solid State Ionics, North Holland Pub. Company. vol. 86-88, 1996, pp. 521-526.

* cited by examiner

INORGANIC REACTION SYSTEM FOR ELECTROCONDUCTIVE PASTE COMPOSITION

CROSS-REFERENCE TO RELATED APPLICATIONS

This patent application claims the benefit of U.S. Provisional Patent Application No. 61/625,383, filed on Apr. 17, 2012, and U.S. Provisional Application No. 61/684,884 filed Aug. 20, 2012, whose disclosures are hereby incorporated by reference in their entirety into the present disclosure.

FIELD OF THE INVENTION

The invention relates to an inorganic reaction system for use in electroconductive pastes. Specifically, the inorganic reaction system comprises conductive glass. Another aspect of the invention relates to an electroconductive paste composition comprising a conductive metallic component, an inorganic reaction system, and an organic vehicle. Another aspect of the invention relates to a solar cell produced by applying an electroconductive paste, which comprises an electroconductive metal, an inorganic reaction system, and an organic vehicle, to a silicon wafer. Another aspect of the invention relates to a method of making a solar cell using the electroconductive paste of the invention. Yet another aspect of the invention relates to a solar cell module assembled using solar cells produced by applying an electroconductive paste to a silicon wafer, wherein the electroconductive paste comprises an electroconductive metal, an inorganic reaction system, and an organic vehicle.

BACKGROUND OF THE INVENTION

Solar cells are devices that convert the energy of light into electricity using the photovoltaic effect. Solar power is an attractive green energy source because it is sustainable and produces only non-polluting by-products. Accordingly, a great deal of research is currently being devoted to developing solar cells with enhanced efficiency while continuously lowering material and manufacturing costs.

When light hits a solar cell, a fraction of the incident light is reflected by the surface and the remainder transmitted into the solar cell. The transmitted light/photons are absorbed by the solar cell, which is usually made of a semiconducting material, such as silicon. The absorbed photon energy excites electrons from the atoms of the semiconducting material, generating electron-hole pairs. These electron-hole pairs are then separated by p-n junctions and collected by conductive electrodes that are applied on the solar cell surface. These conductive electrodes typically comprise an electroconductive paste composition.

Traditional electroconductive pastes contain metallic particles, glass frit, and an organic vehicle. These components are usually selected to take full advantage of the theoretical potential of the resulting solar cell. The metallic particles act as the conductive component of the surface electrode. The organic vehicle provides the medium through which all of the components are combined. The glass frit component has a number of purposes, one of which is to improve contact between the electrode and the underlying silicon surface. It is desirable to maximize the contact between the electroconductive paste and silicon surface, as well as with the metallic particles themselves, so that the charge carriers can flow through the interface and then through the surface electrodes. The glass particles in the electroconductive paste provide the media by which the paste builds contact between the metal and the underlying silicon substrate. The glass component must have specific properties in order to achieve optimal contact. Thus, the goal is to minimize contact resistance while improving solar cell efficiency. Known glass compositions have high contact resistance due to the insulating effect of the glass in the interface of the electrode and silicon wafer. Further, glass frit is known to have wide melting temperature ranges, making their behavior strongly dependent on the processing parameters. Accordingly, electroconductive paste compositions with improved electrical properties are desirable. Specifically, electroconductive paste compositions with improved glass frit components are needed.

SUMMARY OF THE INVENTION

The invention provides an electroconductive paste composition comprising metallic particles, an inorganic reaction system comprising, a conductive glass material having a conductivity of greater than $1 \times 10^{-12}$ S·cm$^{-1}$, and an organic vehicle. In one embodiment of the invention, the conductive glass material having a conductivity of greater than $1 \times 10^{-11}$ S·cm$^{-1}$.

In another embodiment of the invention, the conductive glass material comprises silver. In a further embodiment of the invention, the conductive glass material comprises silver oxide or silver halide, more preferably silver bromide, silver iodine, or silver chloride.

In one embodiment of the invention, the electroconductive paste composition further comprising an additional matrix forming composition. In one embodiment of the invention, the additional matrix forming composition comprises lead. In another embodiment of the invention, the additional matrix forming composition comprises a lead containing glass composition. In one embodiment of the invention, the additional matrix forming composition is free of intentionally added lead.

In one embodiment of the invention, the conductive glass material comprises silver up to 85 mol. % of the matrix forming composition, or up to 75 mol. % of the matrix forming composition, or up to 60 mol. % of the matrix forming composition, or up to 40 mol. % of the matrix forming composition, or up to 20 mol. % of the matrix forming composition, or up to 10 mol.% of the matrix forming composition. In another embodiment of the invention, the conductive glass material comprises silver between 20-85 mol. % of the matrix forming composition, or between 40-75 mol. % of the matrix forming composition, or between 50-70 mol. % of the matrix forming composition. In a further embodiment of the invention, the conductive glass material comprises up to 80 wt. % of silver, preferably up to 50 wt. %, more preferably up to 30 wt. %, and most preferably about 1-20 wt. % of silver.

The invention also provides an electroconductive paste composition comprising metallic particles, an inorganic reaction system comprising a first matrix forming composition comprising silver, and a second matrix forming composition, and an organic vehicle.

In one embodiment of the invention, the first matrix forming composition comprises a silver containing glass composition. In another embodiment of the invention, the silver containing glass composition comprises silver oxide. In a further embodiment of the invention, the silver containing glass composition comprises silver oxide, tellurium oxide, and zinc oxide.

In one embodiment of the invention, the silver containing glass composition comprises silver halide, more preferably silver bromide, silver iodine or silver chloride.

In another embodiment of the invention, the silver containing glass composition comprises silver oxide and silver halide.

In a further embodiment of the invention, the second matrix forming composition comprises lead. In one embodiment of the invention, the second matrix forming composition comprises a lead containing glass composition. In another embodiment of the invention, the second matrix forming composition is free of intentionally added lead.

In one embodiment of the invention, the first matrix forming composition comprises silver up to 85 mol. %, or up to 75 mol. %, or up to 60 mol. %, or up to 40 mol. %, or up to 20 mol. %, or up to 10 mol. % of the first matrix forming composition. In another embodiment of the invention, the first matrix forming composition comprises silver between 20-85 mol. %, or between 40-75 mol. %, or between 50-70 mol. % of the first matrix forming composition. In a further embodiment of the invention, the first matrix forming composition comprises up to 80 wt. % of silver, preferably up to 50 wt. %, more preferably up to 30 wt. %, and most preferably about 1-20 wt. % of silver. In an additional embodiment of the invention, the first matrix forming composition is about 5-95 wt. % of the IRS, preferably about 20-60 wt. %, and most preferably about 20-50 wt. % of IRS.

In one embodiment of the invention, the second matrix forming composition is between 5-95 wt. % of the IRS, preferably about 40-95 wt. %, and most preferably about 50-95 wt. % of IRS.

the invention further provides an electroconductive paste composition comprising metallic particles, an inorganic reaction system comprising a matrix forming composition comprising lead and a silver compound, and an organic vehicle.

In one embodiment of the invention, the matrix forming composition comprises a silver containing glass composition. In another embodiment of the invention, the silver compound is silver oxide. In a further embodiment of the invention, the silver compound is silver halide, preferably silver iodine, silver bromide or silver chloride. In an additional embodiment of the invention, the silver compound comprises silver oxide and silver halide.

In one embodiment of the invention, the matrix forming composition comprises silver up to 85 mol. %, or up to 75 mol. %, or up to 60 mol. %, or up to 40 mol. %, or up to 20 mol. %, or up to 10 mol. % of the first matrix forming composition. In another embodiment of the invention, the matrix forming composition comprises silver between 20-85 mol. %, or between 40-75 mol. %, or between 50-70 mol. % of the first matrix forming composition. In a further embodiment of the invention, the matrix forming composition comprises up to 80 wt. % of silver, preferably up to 50 wt. %, more preferably up to 30 wt. %, and most preferably about 1-20 wt. % of silver.

In one embodiment of the invention, the matrix forming composition further comprises a tellurium compound, preferably tellurium oxide. In another embodiment of the invention, the matrix forming composition comprises 30-99% tellurium oxide.

In one embodiment of the invention, the matrix forming composition further comprises a zinc compound, preferably zinc oxide. In another embodiment of the invention, the matrix forming composition comprises 0-30% zinc oxide.

The invention also provides an electroconductive paste composition comprising metallic particles, an inorganic reaction system comprising a matrix forming composition comprising silver halide, and an organic vehicle.

In one embodiment of the invention, the matrix forming composition comprises 0.5-95% silver halide. In another embodiment of the invention, the matrix forming composition further comprises silver oxide. In a further embodiment of the invention, the matrix forming composition comprises 0.5-60 wt. % silver oxide In one embodiment of the invention, the matrix forming composition further comprises a tellurium compound, preferably tellurium oxide.

In another embodiment of the invention, the matrix forming composition further comprises a zinc compound, preferably zinc oxide.

In one embodiment of the invention, the matrix forming composition further comprises lead, preferably lead oxide.

In another embodiment of the invention, the matrix forming composition is free of intentionally added lead.

The invention further provides an electroconductive paste composition comprising metallic particles, an inorganic reaction system comprising silver-tellurium-zinc-oxide, and an organic vehicle.

In one embodiment of the invention, the silver-tellurium-zinc-oxide is

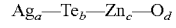

$$Ag_a\text{—}Te_b\text{—}Zn_c\text{—}O_d$$

where $0 \le a, b,$ or $c \le 1$, and $O_d$ charge balances the $Ag_a$—$Te_b$—$Zn_c$ components.

In one embodiment of the invention, a:b is between 5:95 and 95:5, more preferably, a:b is between 1:10 and 10:1. In another embodiment of the invention, b:c is between 5:95 and 95:5, more preferably between 1:1 and 20:1.

In a further embodiment of the invention, the silver-tellurium-zinc-oxide comprises about 30-99 wt. % (of total silver-tellurium-zinc-oxide) of $TeO_2$, about 0-30 wt. % ZnO, and about 0-30 wt. % $Ag_2O$.

In one embodiment of the invention, the silver-tellurium-zinc-oxide is about 5-95 wt. % of IRS, preferably about 20-60 wt. % of the IRS, more preferably about 20-50 wt. % of IRS.

In another embodiment of the invention, the silver-tellurium-zinc-oxide further comprises at least one selected from the group consisting of alkaline oxides, alkaline earth metal oxides, rare earth metal oxides, and Pb, Bi, Al, Ga, Si, Ge, Sn, P, Sb, Nb, Ta, V, Ti, Mo, or W oxides.

In one embodiment of the invention, the electroconductive paste composition further comprising an additional matrix forming composition. In one embodiment of the invention, the additional matrix forming composition comprises lead. In another embodiment of the invention, the additional matrix forming composition comprises a lead containing glass composition. In a further embodiment of the invention, the additional matrix forming composition is free of intentionally added lead.

The invention further provides an electroconductive paste composition comprising metallic particles, an inorganic reaction system comprising a silver halide matrix forming composition according to

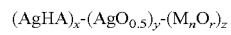

$$(AgHA)_x\text{-}(AgO_{0.5})_y\text{-}(M_nO_r)_z$$

wherein HA is Br, I, Cl, or F;

M is selected from the group consisting of Pb, Bi, Li, Na, K, Mg, Sr, Ba, Zn, P, B, Si, Ag, Al, Ti, W, V, Cr, Mn, Co, Ni, Cu, Nb, Ta, Te, Th, Ge, Mo, La and Ce;

$n > 0$, and $O_r$ charge balances $M_n$, and an organic vehicle.

In one embodiment of the invention, $0 \le x, y,$ or $z \le 1$, x:y is 0:100 to 95:5, more preferably x:y is 0:100 to 75:25, and x:z is 0:100 to 95:5, more preferably x:z is 0:100 to 80:20. In another embodiment of the invention, HA is Br or I. In a further embodiment of the invention, M is at least one selected from the group consisting of Te, Pb, P, Zn, and B.

In one embodiment of the invention, the silver halide matrix forming composition comprises about 0.5-95 wt. % (of total silver halide matrix forming composition) of silver halide, about 0.5-60 wt. % $Ag_2O$ and about 0.5-95 wt. % other oxides.

In another embodiment of the invention, the silver halide matrix forming composition further comprises at least one selected from the group consisting of alkaline oxides, alkaline earth metal oxides, rare earth metal oxides, and Pb, Bi, Al, Ga, Si, Ge, Sn, B, P, Sb, Te, Nb, Ta, V, Ti, Mo, or W oxides.

In a further embodiment of the invention, the inorganic reaction system is about 1-15 wt. % of total electroconductive paste.

In an additional embodiment of the invention, the silver halide matrix forming composition comprises about 5-95 wt. % (of total inorganic reaction system), preferably about 5-60 wt. %, most preferably about 5-50 wt. %.

According to any embodiments of the invention, the metallic particles may be at least one selected from the group consisting of silver, gold, copper, and nickel. According to any embodiments of the invention, the metallic particles are preferably silver.

According to any embodiments of the invention, the metallic particles may be about 50-95 wt. % of paste.

According to any embodiments of the invention, the organic vehicle may comprise a binder, a surfactant, an organic solvent, and a thixotropic agent.

According to any embodiments of the invention, the organic vehicle may be about 1-20 wt. % of electroconductive paste.

According to any embodiments of the invention, the binder may comprise at least one selected from the group consisting of ethylcellulose or phenolic resin, acrylic, polyvinyl butyral or polyester resin, polycarbonate, polyethylene or polyurethane resins, and rosin derivatives.

According to any embodiments of the invention, the solvent may comprise at least one selected from the group consisting of carbitol, terpineol, hexyl carbitol, texanol, butyl carbitol, butyl carbitol acetate, and dimethyladipate or glycol ether.

According to any embodiments of the invention, the surfactant may comprise at least one selected from the group consisting of polyethyleneoxide, polyethyleneglycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof.

The invention further provides a solar cell produced by applying an electroconductive paste according to any of the previously described embodiments to a silicon wafer, and firing the silicon wafer. The invention further provides a solar cell module comprising electrically interconnected solar cells as previously described.

The invention further provides a method of producing a solar cell, comprising the steps of providing a silicon wafer, applying an electroconductive paste according to any of the previously described embodiments to the silicon wafer, and firing the silicon wafer. In one embodiment of the method, the silicon wafer comprises an antireflective coating. In another embodiment of the method, the electroconductive paste is applied to the front side of the silicon wafer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
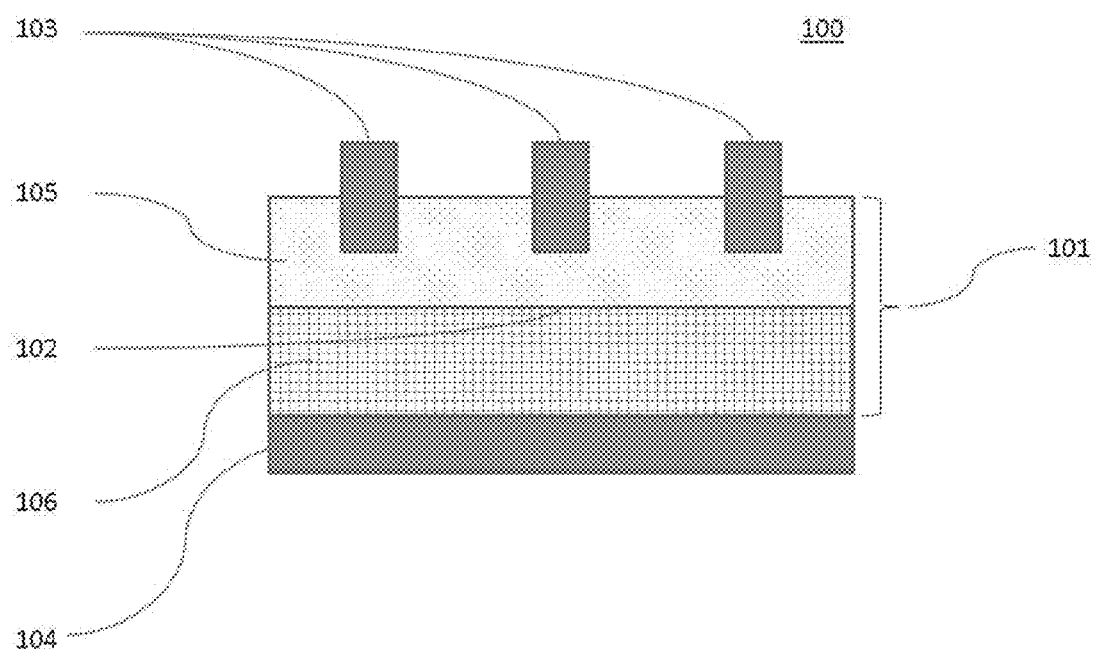
FIG. 1 is a cross-sectional end view of the minimum required layer configuration for a solar cell in accordance with an exemplary embodiment of the present invention.

The invention relates to electroconductive paste compositions as used in the manufacturing of solar cells. Electroconductive pastes typically comprise metallic particles, glass frit, and an organic vehicle. While not limited to such an application, such pastes may be used to form an electrical contact layer or electrode on a solar cell. Specifically, the pastes may be applied to the front side of a solar cell or to the back side of a solar cell and provide the path by which conductivity occurs between cells.

Inorganic Reaction System (IRS)

In one aspect, the invention relates to an inorganic reaction system for use, for example, in an electroconductive paste composition.

The IRS of the invention replaces the role of the traditional glass frit component. First, the IRS provides a delivery media for the metallic particles, allowing them to migrate from the paste to the interface of the metal conductor and the semiconductor substrate. The IRS also provides a reaction media for the paste components to undergo physical and chemical reactions at the interface. Physical reactions include, but are not limited to, melting, dissolving, diffusing, sintering, precipitating, and crystallizing. Chemical reactions include, but are not limited to, synthesis (forming new chemical bonds) and decomposition, reduction and oxidation, and phase transitioning. Lastly, the IRS acts as an adhesion media that provides the bonding between the metal conductor and the semiconductor substrate, thereby securing reliable electrical contact performance during the lifetime of the solar device. Although intended to achieve the same effects, existing glass frit compositions can result in high contact resistance due to the insulating effect of the glass in the interface of the metallic layer and silicon wafer. The IRS of the invention acts as a delivery, reaction, and adhesion media, but provides much lower contact resistance and higher overall cell efficiency. According to each embodiment, the IRS is about 1-15 wt. % of paste, preferably about 1-8 wt. %, even more preferably about 1-5 wt. % of paste.

The IRS typically comprises at least one matrix forming composition. The matrix forming composition fuses or sinters at the firing temperature of the invention IRS and/or the electroconductive paste comprising an IRS according to the invention. The matrix forming composition serves as a distribution medium for the various components of the IRS and electroconductive paste. The firing temperature is selected based on the composition of the IRS and electro-conductive paste, wherein ideal metallization is achieved. The peak firing temperature is usually above 400° C., preferably above 600° C. Typically, the peak firing temperature is above the glass transition temperature ($T_g$) of the components of the matrix forming composition if the matrix forming composition exhibits such a characteristic. At the $T_g$, an amorphous substance transforms from a rigid solid to a partially mobile undercooled melt which allows for distribution of the composition. The desired $T_g$ of the IRS materials is typically in a range from about 100-700° C., preferably about 150-600° C., and most preferably about 200-500° C. The duration of the exposure of the electro-conductive paste to the firing temperature may be several seconds to several minutes.

Further, the matrix forming composition of this invention may comprise crystalline or partially crystalline materials. The matrix forming composition may be a glass, ceramic, or any compounds known to one skilled in the art that can form a matrix at elevated temperature. Traditionally used glass fits in electroconductive paste are just examples. Another example is a mixture of amorphous, crystalline, or semi-crystalline materials, e.g., oxides that can form a matrix at the firing temperature of the IRS and electroconductive paste.

The IRS of this invention may comprise various compounds including, but not limited to, oxides, salts, halides, chalcogenides, organometallic compounds, fluorides, sulfides, alloys and elemental materials. Examples of organometallic compounds may be, but are not limited to, lead acetate, bismuth acetate and organolithium compounds.

Additionally, the IRS may also comprise oxides or compounds known to one skilled in the art to adjust processing parameters, such as glass transition temperature. The IRS may also comprise other oxides or other compounds of silicon, boron, aluminum, bismuth, lithium, sodium, magnesium, zinc, titanium and zirconium. Other matrix formers or modifiers, such as germanium oxide, vanadium oxide, tungsten oxide, molybdenum oxides, niobium oxides, tin oxides, indium oxides, other alkaline and alkaline earth metal (such as K, Rb, Cs and Be, Ca, Sr, Ba) compounds, rare earth oxides (such as $La_2O_3$, cerium oxides), phosphorus oxides or metal phosphates, transition metal oxides (such as copper oxides and chromium oxides), metal halides (such as lead fluorides and zinc fluorides) may also be part of the IRS composition. The aforementioned oxides and compounds may be incorporated in the matrix forming composition of the IRS, or incorporated in the IRS as additives.

The inorganic reaction systems described herein may also comprise additional additives, which can be any oxides and compounds known to one skilled in the art to be useful as additives. For example, boron, aluminum, bismuth, lithium, sodium, magnesium, zinc, and phosphate oxides and compounds can be used. According to certain embodiments disclosed herein, the IRS may comprise at least one additive selected from the group consisting of: $Al_2O_3$, ZnO, $Li_2O$, $Ag_2O$, AgO, $MoO_3$, $TiO_2$, $TeO_2$, CoO, $Co_2O_3$, $Bi_2O_3$, $CeO_2$, $CeF_4$, $SiO_2$, MgO, PbO, $ZrO_2$, $HfO_2$, $In_2O_3$, $SnO_2$, $P_2O_5$, $Ta_2O_5$, $B_2O_3$, $Ag_3PO_4$, $LiCoO_2$, $LiNiO_2$, $Ni_3(PO_4)_2$, NiO, or lithium phosphates. Additives in the IRS may be used to adjust IRS performance, such as optimizing contact characteristics with the silicon substrate. These additives may also be incorporated in the matrix forming composition in whole or in part.

It is well known to the person skilled in the art that the IRS materials can exhibit a variety of shapes, surface natures, sizes, surface area to volume ratios and coating layers. A large number of shapes of IRS material particles are known to the person skilled in the art. Some examples are spherical, angular, elongated (rod or needle like) and flat (sheet like). IRS particles may also be present as a combination of particles of different shapes. IRS particles with a shape, or combination of shapes, which favors advantageous sintering, adhesion, electrical contact and electrical conductivity of the produced electrode are preferred according to the invention.

A way to characterize the shape and surface of a particle is by its surface area to volume ratio. The lowest value for the surface area to volume ratio of a particle is embodied by a sphere with a smooth surface. The less uniform and uneven a shape is, the higher its surface area to volume ratio will be. In one embodiment according to the invention, IRS particles with a high surface area to volume ratio are preferred, preferably in a range from about $1.0 \times 10^7$ to about $1.0 \times 10^9$ m$^{-1}$, more preferably in a range from about $5.0 \times 10^7$ to about $5.0 \times 10^8$ m$^{-1}$ and most preferably in a range from about $1.0 \times 10^8$ to about $5.0 \times 10^8$ m$^{-1}$. In another embodiment according to the invention, IRS particles with a low surface area to volume ratio are preferred, preferably in a range from about $6 \times 10^5$ to about $8.0 \times 10^6$ m$^{-1}$, more preferably in a range from about $1.0 \times 10^6$ to about $6.0 \times 10^6$ m$^{-1}$ and most preferably in a range from about $2.0 \times 10^6$ to about $4.0 \times 10^6$ m$^{-1}$.

The average particles diameter $d_{50}$, and the associated parameters $d_{10}$ and $d_{90}$ are characteristics of particles well known to the person skilled in the art. It is preferred according to the invention that the average particle diameter $d_{50}$ of the IRS particles lies in a range from about 0.5 to about 10 μm, more preferably in a range from about 1 to about 7 μm and most preferably in a range from about 1 to about 5 μm. The determination of the particles diameter $d_{50}$ is well known to the person skilled in the art.

The IRS particles may be present with a surface coating. Any such coating known to the person skilled in the art and which he considers to be suitable in the context of the invention can be employed on the IRS particles. Preferred coatings according to the invention are those coatings which promote improved printing, sintering and etching characteristics of the electro-conductive paste. If such a coating is present, it is preferred according to the invention for that coating to correspond to no more than about 10 wt. %, preferably no more than about 8 wt. %, most preferably no more than about 5 wt. %, in each case based on the total weight of the IRS particles.

Conductive Glass Composition

As stated above, the IRS of the invention may comprise a matrix forming composition which is a conductive glass material. The glass material herein described may be amorphous, crystalline, or partially crystalline. It is within the scope of the invention that glass materials may refer to any materials or mixture of materials that are amorphous or partially crystalline after exposure to a temperature that is at or above the glass transition temperature ($T_g$) of the materials or mixture, or exposure to a temperature that is at or above the firing temperature of an electro-conductive paste comprising such materials or mixture of materials. While glass compositions are typically electrical insulators at temperature blow $T_g$, the IRS described herein may incorporate glass materials that are conductive at temperatures below $T_g$. Incorporating glass materials with high conductivity, or in low resistivity, the IRS, results in electro-conductive pastes that provide lower contact resistance for the overall solar cell and improved solar cell efficiency.

The conductive glass materials may be incorporated in the IRS as the matrix forming composition, or be incorporated in the IRS in addition to other matrix forming compositions. It is expected that incorporation of conductive glass compositions would increase the overall conductivity of the IRS.

The electrical resistivity ρ is defined as:

$$\rho = R\frac{A}{l},$$

where:

R is the electrical resistance of a uniform specimen of the material (measured in ohms, Ω);

l is the length of the piece of material (measured in meters, m); and

A is the cross-sectional area of the specimen (measured in square meter, $m^2$).

Resistivity has SI units of ohmmeter.

Conductivity σ is defined as the inverse of resistivity:

$$\sigma = \frac{1}{\rho}.$$

Conductivity has SI units of Siemens per meter (S/m).

Examples of conductive glass compositions include, but are not limited to, AgI—$Ag_2SeO_4$, AgI—$Ag_4P_2O_7$, AgI—$Ag_4P_2O_7$—$Pb_2P_2O_7$, AgI—$Ag_2WO_4$, AgI—$Ag_2O$—$V_2O_5$, $Ag_2O$—$B_2O_3$—$P_2O_5$, AgI—$Ag_2S$—$B_2S_3.SiS_2$, AgI—$Ag_2O$—$P_2O_5$, AgBr—$Ag_2O$—$B_2O_3$, $Li_2O$—$SiO_2$, $Li_2O$—$P_2O_5$, $Li_2O$—$P_2O_5$—LiI, $Li_2O$—$P_2O_5$—LiCl, $Li_2O$—$B_2O_3$, $Li_2O$—$B_2O_3$—LiCl, $Li_2O$—$P_2O_5$—$B_2O_3$, Li—P—O—N, Li—S—O—N, $Li_2S$—$P_2S_5$, $Li_2S$—$P_2S_5$—$P_2S_3$, $Li_2S$—$P_2S_5$—$B_2S_3$, $Li_2S$—$SiS_2$—$Li_4SiO_4$, $Li_2S$—$B_2S_3$—$Li_4SiO_4$, and combinations thereof. Table 1 lists bulk conductivity values ($\sigma_{dc}$, $S \cdot cm^{-1}$) for exemplary conductive glass materials.[1]

[1] THIEU DUC THO, ION CONDUCTION MECHANISMS IN FAST ION CONDUCTING OXIDE GLASSES FOR RECHARGEABLE BATTERIES, Doctoral thesis, NATIONAL UNIVERSITY OF SINGAPORE 2011, here in incorporated by reference.

TABLE 1

Conductivity of Various Bulk Glass Materials

| Glasses | $\sigma_{dc}$ (S · $cm^{-1}$) |
|---|---|
| 75AgI—25$Ag_2SeO_4$ | 2.2 × $10^{-2}$ (at 25° C.) |
| 85AgI—15$Ag_4P_2O_7$ | 1.8 × $10^{-2}$ (at 25° C.) |
| 80AgI—20$Ag_2WO_4$ | 1.5 × $10^{-1}$ (at 25° C.) |
| 60AgI—20$Ag_2WO_4$ | 4.0 × $10^{-3}$ (at 25° C.) |
| 50$Ag_2O$—25$B_2O_3$—25$P_2O_5$ | 2.9 × $10^{-4}$ (at 90° C.) |
| 0.4AgI—0.6[0.525$Ag_2S$ + 0.475$B_2S_3$:$SiS_2$] | 4.0 × $10^{-2}$ (at 25° C.) |
| 10$Li_2O$—90$SiO_2$ | 7.0 × $10^{-8}$ (at 150° C.) |
| 50$Li_2O$—50$SiO_2$ | 4.0 × $10^{-5}$ (at 150° C.) |
| 50$Li_2O$—50$P_2O_5$ | 2.4 × $10^{-9}$ (at 25° C.) |
| 62.5$Li_2O$—37.5$P_2O_5$ | 1.6 × $10^{-7}$ (at 25° C.) |
| 33.5$Li_2O$—33.5$P_2O_5$—33LiI | 1.0 × $10^{-6}$ (at 25° C.) |
| 33.5$Li_2O$—33.5$P_2O_5$—33LiBr | 3.2 × $10^{-7}$ (at 25° C.) |
| 35$Li_2O$—35$P_2O_5$—30LiCl | 1.0 × $10^{-7}$ (at 25° C.) |
| 42.5$Li_2O$—57.5$B_2O_3$ | 7.1 × $10^{-8}$ (at 25° C.) |
| 34$Li_2O$—61$B_2O_3$—5LiCl | 1.0 × $10^{-3}$ (at 300° C.) |
| 50$Li_2O$—30$P_2O_5$—20$B_2O_3$ | 1.8 × $10^{-5}$ (at 110° C.) |
| $Li_{2.88}PO_{3.73}N_{0.14}$ (LiPON) | 3.3 × $10^{-6}$ (at 25° C.) |
| $Li_{0.29}S_{0.28}O_{0.35}N_{0.09}$ (LiSON) | 2.0 × $10^{-5}$ (at 25° C.) |
| 70$Li_2S$—30$P_2S_5$ | 9.2 × $10^{-5}$ (at 25° C.) |
| 75$Li_2S$—25$P_2S_5$ | 1.8 × $10^{-4}$ (at 25° C.) |
| 75$Li_2S$—20$P_2S_5$—5$P_2S_3$ | 6.2 × $10^{-4}$ (at 25° C.) |
| 37$Li_2S$—18$P_2S_5$—45LiI | 1.0 × $10^{-3}$ (at 25° C.) |
| 67$Li_2S$—10$P_2S_5$—23$B_2S_3$ | 1.4 × $10^{-4}$ (at 25° C.) |
| 47$Li_2S$—14$SiS_2$—9$P_2S_5$—5$Li_4SiO_4$ | 2.1 × $10^{-3}$ (at 25° C.) |

All of the glass compositions in Table 1 exhibit higher bulk conductivity than standard silicate glass materials (which exhibit $\sigma_{dc}$ in a range of about $1 \times 10^{-13}$ to $1 \times 10^{-17}$ $S \cdot cm^{-1}$). The IRS described herein preferably comprises conductive glass materials having bulk conductivity higher than $1 \times 10^{-12}$ $S \cdot cm^{-1}$, more preferably higher than $1 \times 10^{-11}$ $S \cdot cm^{-1}$. Further, in the examples shown in Table 1, glass compositions comprising silver exhibit higher bulk conductivity than those without silver. Thus, in a preferred embodiment, the IRS comprises a glass material or compound containing silver.

The electrical conductivity of glass samples can quickly assessed by measuring sample resistance, such as using a multi-tester or a universal bridge. The electrical conductivity of glass samples can be also measured as a function of temperature using an impedance meter, such as Tesla® BM 507 or Solartron® 1260. The conductivity can be described by the well known Arrhenius law:

$$\sigma_{dc}(T) = \sigma_0 \exp\left(\frac{-E_a}{k_B T}\right)$$

where $\sigma_o$ is a pre-exponential factor and a characteristic of the material, Ea is the apparent activation energy for conduction, $k_B$ is the Boltzmann's constant, and T the absolute temperature. Glass samples can be prepare into a disc or plate, typically with a cross section area of about 1 $cm^2$ or more, and a thickness of about 1-2 mm. Conductive electrodes, such as coatings of silver, gold, or platinum, can then be deposited on opposite ends of the glass sample. Alternatively, glass powder may be stacked between conductive metal powders, such as silver, and pressed into a pellet in a press, for example, under pressure of about 2 tons/$cm^2$. The conductivity of the glass sample can be measure in the temperature range typically between 273 K to about 20-30 K below the $T_g$ of the glass sample, and at a frequency range between $10^{-2}$-$10^6$ Hz.

The IRS may comprise up to 100 wt. % conductive glass compositions. The IRS may also comprise additional matrix forming compositions or additives in addition to the conductive glass composition. The IRS may comprise 10-90 wt % of conductive glass compositions, 10-90 wt % of additional matrix forming composition, and 0-5 wt % additives.

The Silver Containing Matrix Composition

According to one embodiment of the invention, silver is introduced into the matrix forming composition of the IRS of this invention. The inclusion of silver metal or silver compounds in the IRS greatly improves electrical performance of a resulting electroconductive paste. The IRS of the invention provides improved Ohmic and Schottky contact between the metal conductor (e.g., silver) and the semiconductor emitter (e.g., silicon substrate) in the solar cell. The IRS of the invention is a reactive media with respect to the silicon and creates active areas on the silicon emitter that improve overall contact mechanisms, such as through direct contact, or tunneling. The improved contact properties provide better Ohmic contact and Schottky contact, and therefore better overall solar cell performance. The presence of silver in the IRS decreases contact resistance, increasing both fill factor and solar cell efficiency. Also, the silver-containing IRS system can be easily adapted to different glass fits and glass chemistries for a variety of electroconductive paste applications. The silver-containing IRS system is observed to be at least partially conductive.

A description of methods of incorporating silver particles into glass compositions may be found, for example, in Salwa A. M. Abdel-Hameed & Ahlam M. Fathi, *Preparation and characterization of silver nanoparticles within silicate glass ceramics via modification of ion exchange process*, Journal of Alloys and Compounds 498 (2010) 71-76 or B. Roy and D. Chakravorty, *Electrical conductance of silver nanoparticles grown in glass-ceramic*, Journal of Physics: Condensed Matter 2 (1990) 9323-9334. The first publication discloses a method by which silver can be incorporated into a glass ceramic using an ion exchange process. The second publication discloses a method by which silver can be grown in a glass-ceramic by using seed materials, such as $Zn_2SiO_4$. These methods are disadvantageous for use in electroconductive pastes, as both require significant annealing time which increases production costs. Additionally, neither of the glasses resulting from these methods can be used in solar cell pastes, because in both, there is a strong tendency for the silver phase to separate during firing, which results in the loss of the desired glass conductivity. The silver containing matrix forming composition overcomes the short comings of these prior compositions and is suitable for use in electroconductive pastes.

According to one embodiment, the silver containing matrix forming composition comprises silver up to 85 mol. % of the matrix forming composition, or up to 75 mol. % of the matrix forming composition, or up to 60 mol. % of the matrix forming composition, or up to 40 mol. % of the matrix forming composition, up to 20 mol. % of the matrix forming composition, or up to 10 mol. % of the matrix forming composition. In one embodiment, the silver containing matrix forming composition comprises silver between 20-85 mol. % of the matrix forming composition, or between 40-75 mol. of the matrix forming composition, or between 50-70 mol. % of the matrix forming composition.

According to one embodiment, the silver containing matrix forming composition comprises up to 80 wt. % of silver, preferably up to 50 wt. %, more preferably up to 30 wt. %, and most preferably about 1-20 wt. % of silver. The silver containing matrix forming composition may comprise silver metal or silver compound(s) as starting materials. The silver compounds included in the silver containing matrix forming composition may decompose or react to other components or the IRS and result in the formation of crystalline semi-crystalline silver or other forms of silver, such as complex multi-member silver metal oxides. The silver compound(s) may include, but is/are not limited to, silver oxides, silver salts, organometallic silver or any other silver compounds known to one skilled in the art that can be incorporated in a matrix forming composition. For example, the silver compounds(s) may include, but are not limited to, $Ag_2F$, $AgBF_4$, $AgBr$, $AgBrO_3$, $AgCN$, $AgCNO$, $AgCl$, $AgClO_3$, $AgClO_4$, $Ag_2CO_3$, $AgF$, $AgI$, $AgMnO_4$, $AgIO_3$, $AgSCN$, $AgNO_3$, $AgN_3$, $Ag_3N$, $AgC_2H_3O_2$, $AgC_{22}H_{43}O_2$, $AgC_5H_7O_2$, $AgC_4H_3N_2NSO_2C_6H_4NH_2$, $AgCF_3SO_3$, $AgPF_6$, $Ag_2C_2$, $Ag_2C_2O_4$, $Ag_2CrO_4$, $Ag_2Cr_2O_7$, $AgVO_3$, $Ag_2WO_4$, $Ag_3AsO_4$, $Ag_2MoO_4$, $Ag_2O$, $Ag_2S$, $Ag_2SO_4$, $Ag_2Se$, $Ag_2SeO_3$, $Ag_2Te$, $Ag_2TeO_3$, $Ag_3PO_4$, $KAg(CN)_2$, $RbAg_4I_5$, $Ag(NH_3)_2NO_3$, $AgF_2$, $Ag_4O_4$, $AgN_3$, phenylsilver, alkenylsilver, silver mesitylene, silver triphenylphosphonium methylide, or silver-NHC complexes. Silver containing glass or semi-crystalline systems of silver oxides or silver salts are also suitable for use as starting materials for the silver containing matrix forming compositions.

According to one embodiment, the silver containing matrix forming composition may comprise a silver containing glass composition, which may comprise silver oxide, silver halide, or both. Preferably, the silver halide is one of silver bromide, silver iodine or silver chloride.

The Silver Containing Matrix Composition Comprising ATZ Oxides

According to one embodiment, the silver containing matrix forming composition may comprise silver-tellurium-zinc-oxide (ATZ oxide), which may be expressed as:

$$Ag_a\text{—}Te_b\text{—}Zn_c\text{—}O_d \qquad (I)$$

Where $0 \le a$, b, or $c \le 1$, and $O_d$ charge balances the $Ag_a$—$Te_b$—$Zn_c$ components. Typically, a:b is between 5:95 and 95:5, more preferably between 1:10 and 10:1. Typically, b:c is between 5:95 and 95:5, more preferably between 1:1 and 20:1. The ATZ oxides may be amorphous or partially crystalline.

The ATZ oxides may also optionally comprise other oxides materials, which for example may include, but are not limited to, alkaline oxides, alkaline earth metal oxides, rare earth metal oxides, Pb, Bi, Al, Ga, Si, Ge, Sn, P, Sb, Bi, Nb, Ta, V, Ti, Mo, or W oxides.

In a particular embodiment, the ATZ oxides may be formed using silver oxide, tellurium oxide, and zinc oxide as starting materials. In this particular example, the ATZ oxides may comprise (in wt. % of total ATZ oxides) about 30-99 wt. % $TeO_2$, about 0-30 wt. % ZnO and about 0-30 wt. % $Ag_2O$. Optionally, the ATZ oxides may comprise about 1-10 wt. % other oxide materials. The other optional oxide materials may include, but are not limited to, alkaline oxides, alkaline earth metal oxides, rare earth metal oxides, Pb, Bi, Al, Ga, Si, Ge, Sn, P, Sb, Bi, Nb, Ta, V, Ti, Mo, or W oxides.

The ATZ oxide is typically about 5-95 wt. % of total IRS, preferably about 20-60 wt. % of the total IRS, more preferably about 20-50 wt. % of the total IRS.

The ATZ oxide composition may be made by any process known to one skilled in the art. For example, ATZ oxide glass components, in powder form, may be mixed together in a V-comb blender. The mixture may then be heated to about 580-620° C. for approximately 60 minutes, and then 780-820° C. for approximately 20 minutes. This melting temperature range is much lower than traditional lead-containing glass fits, which are heated to about 800-1200° C., depending upon their composition. The glass is then quenched in deionized water, taking on a sand-like consistency. This coarse glass powder is then milled, such as in a ball mill or jet mill, until a fine powder results.

The ATZ oxides may be incorporated in the IRS with additional oxide materials as a single matrix forming composition. The additional oxide materials may include Pb, Bi, Al, Ga, Si, Ge, Sn, P, Sb, Nb, Ta, V, Ti, Mo, or W oxides. The additional oxide materials may be about 0-40 wt. % of the IRS, more preferably about 20-30 wt. % of the IRS. The additional oxide materials may be melted together with the ATZ oxides and form an essentially uniform matrix forming composition.

The ATZ oxides may be incorporated in the IRS with a second separate matrix forming composition. The second separate matrix forming composition may be about 5-95 wt. % of total IRS, preferably about 40-95 wt. % of the total IRS, more preferably about 50-95 wt. % of the total IRS. The second matrix forming compositions may be glass, ceramic, or any other compound known to one skilled in the art that can form a matrix at elevated temperature, and may comprise crystalline, partially crystalline or amorphous materials. The second matrix forming compositions may include Pb, Bi, Al, Ga, Si, Ge, Sn, P, Sb, Bi, Nb, Ta, V, Ti, Mo, or W oxides.

In certain embodiments, the second matrix forming composition may comprise a lead containing glass composition. Alternatively, the second matrix forming composition may be "free of intentionally added lead." A composition that is "free of intentionally added lead" is one which is free of lead entirely, or has a lead oxide content of less than 0.5 wt. % based on total weight of glass (due to incidental impurities).

The Silver Containing Matrix Composition Comprising Silver Halide

According to this embodiment, the silver containing matrix forming composition may comprise a silver halide. Preferably, the silver halide is one of silver bromide, silver iodine, silver chloride, or silver fluoride, more preferably, silver bromide, silver iodine, or silver chloride. The silver halide may be incorporated into the matrix forming composition with additional oxide materials, which may include may include Pb, Bi, Al, Ga, Si, Ge, Sn, P, Sb, Bi, Nb, Ta, Te, V, Ti, Ag, Zn, Mo, or W oxides. The silver halide matrix forming composition may comprise crystalline, partially crystalline, or amorphous materials.

In one embodiment, the silver halide is incorporated in the matrix forming composition as:

$$(AgHA)_x\text{-}(AgO_{0.5})_y\text{---}(M_nO_r)_z \qquad (II)$$

Where HA is halide, e.g., Br, I, Cl, or F;

M is an element, which can be at least one of Pb, Bi, Li, Na, K, Mg, Sr, Ba, Zn, P, B, Si, Ag, Al, Ti, W, V, Cr, Mn, Co, Ni, Cu, Nb, Ta, Te, Th, Ge, Mo, La or Ce, $n \geq 0$, and $O_r$ charge balances $M_n$.

Where $0 \leq x$, y, or $z \leq 1$. Typically, x:y is 0:100 to 95:5, more preferably 0:100 to 75:25, and x:z is 0:100 to 95:5, more preferably 0:100 to 80:20.

The silver halide matrix forming composition may also optionally comprise other oxides materials, which for example may include, but are not limited to, alkaline oxides, alkaline earth metal oxides, rare earth metal oxides, Pb, Bi, Al, Ga, Si, Ge, Sn, B, P, Sb, Te, Nb, Ta, V, Ti, Mo, or W oxides.

In a particular embodiment, the silver halide matrix forming composition may be formed using silver halide (e.g., AgI, AgBr, AgCl, or AgF), silver oxide, and other oxide as starting materials. In this particular example, the silver halide matrix forming composition may comprise (in wt. % of total silver halide matrix forming composition) about 0.5-95 wt. % Ag halide, about 0.5-60 wt. % $Ag_2O$ and about 0.5-95 wt. % other oxides. The silver halide matrix forming composition may also comprise additional optional oxide materials, which may include, but are not limited to, alkaline oxides, alkaline earth metal oxides, rare earth metal oxides, Pb, Bi, Al, Ga, Si, Ge, Sn, B, P, Sb, Te, Nb, Ta, V, Ti, Mo, or W oxides.

The silver halide matrix forming composition is typically about 5-95 wt. % of total IRS, preferably about 5-60 wt. % of the total IRS, more preferably about 5-50 wt. % of the total IRS.

In one embodiment, HA is iodine.

In one embodiment, M is tellurium, preferably tellurium oxide.

In a preferred embodiment the silver halide comprising matrix forming composition is $(AgI)_x\text{---}(AgO_{0.5})_y\text{---}(TeO_2)_z$, where x:y is 0:1 to 4:1, more preferably 0:1 to 2:1, and x:z is 0:1 to 4:1, more preferably 0:1 to 2:1. The $AgO_{0.5}$ may be up to 52 m. %, the AgI may be up to 58 m. %, and combined $AgO_{0.5}$+AgI may be up to 85 m. %. The conductivity (log $\sigma_{25}$, S/cm$^{-1}$) of the $TeO_2$—$AgO_{0.5}$—AgI at room temperature (about 25° C. or 298K) is about −2 to −5 as reported in A. M. Zahra, C. Y. Zahra, M. Ganteaume, S. Rossignol, B. Tanguy, J. J. Videau and J. Portier, *New Silver Tellurite Glasses*, Journal of Thermal Analysis, Vol. 38 (1992) 749-760, and G. El-Damrawi, *Silver ion transporting mechanism in superionic conducting AgI—$Ag_2O$—$TeO_2$ glasses*, J. Phys.: Condens. Matter 11 (1999) 6385-6394, herein incorporated by reference. It is observed that the conductivity of the $TeO_2$—$AgO_{0.5}$—AgI glass composition increase with the increase of the molar percentage of AgI, which peaks at about 50-66 m. % AgI.

Another example of silver containing matrix forming composition comprising lead oxide and silver halide, for example $(AgI)_x\text{---}(AgO_{0.5})_y\text{---}(PbO)_z\text{---}(P_2O_5)_{z'}$, where x:y is 0:1 to 3:2, more preferably 0:1 to 1:1, and x:z is 0:1 to 10:1, more preferably 0:1 to 1:1. The glasses may be prepared using $AgNO_3$, AgI, PbO and $NH_4H_2PO_4$ as starting materials. The $AgO_{0.5}$ may be up to 75 m. %, the AgI may be up to 43 m. %, and combined $AgO_{0.5}$+AgI may be up to 83 m. %. Conductivity (log $\sigma_{25}$, S/cm$^{-1}$) at room temperature of a specific example $Pb_2P_2O_7$—$Ag_4P_2O_7$—AgI is between −4 to −9 as reported in N. Dridi, A. Boukhari, J. M. Réau, *Glass formation and conductivity in the $Pb_2P_2O_7$—$Ag_4P_2O_7$—AgI system*, Materials Letters 50 2001.302-307, herein incorporated by reference.

A further example of silver containing matrix forming composition comprising boron oxide and silver halide, for example $(AgI)_x\text{-}(AgO_{0.5})_y\text{---}(B_2O_3)_z$ and $(AgBr)_{x'}\text{---}(AgO_{0.5})_{y'}\text{-}(B_2O_3)_{z'}$, where x:y is 0:1 to 2:1, more preferably 0:1 to 1:1; x':y' is 0:1 to 3:2, more preferably 0:1 to 1:1; x:z is 0:1 to 86:14, more preferably 0:1 to 5:1; x':z' is 0:1 to 82:18, more preferably 0:1 to 5:1. The $AgO_{0.5}$ may be up to 65 m. %, the AgI may be up to 55 m. %, and combined $AgO_{0.5}$+AgI may be up to 92 m. %. The $AgO_{0.5}$ may be up to 65 m. %, the AgBr may be up to 45 m. %, and combined $AgO_{0.5}$+AgBr may be up to 92 m. %. Conductivity ($\sigma_{25}$) at room temperature for $(AgI)_x\text{---}(AgO_{0.5})_y\text{---}(B_2O_3)_z$ and $(AgBr)_x\text{-}(AgO_{0.5})_y\text{---}(B_2O_3)_z$ is between $10^{-1}$ to $1 \times 10^{-6} \Omega^{-1}$ cm$^{-1}$ as reported in Tsutomu MINAMI, Yujiro IKEDA, and Masami TANAKA, *INFRARED SPECTRA, GLASS TRANSITION TEMPERATURE, AND CONDUCTIVITY OF SUPERIONIC CONDUCTING GLASSES IN THE SYSTEMS AgX—$Ag_2O$—$B_2O_3$ (X=I, Br)*, Journal of Non-Crystalline Solids 52 (1982) 159-169, herein incorporated by reference.

A further example of silver containing matrix forming composition comprising phosphate oxide and silver halide, for example $(AgI)_x\text{---}(AgO_{0.5})_y\text{---}(P_2O_5)_z$, where x:y is 1:1 to 4:1, more preferably 1:1 to 3:1; x:z is 1:1 to 10:1, more preferably 1:1 to 9:1. The $AgO_{0.5}$ may be up to 55 m. %, the AgI may be up to 58 m. %, and combined $AgO_{0.5}$+AgI may be up to 95 m. %. Conductivity ($\sigma_{25}$) at room temperature for $(AgI)_x\text{---}(AgO_{0.5})_y\text{---}(P_2O_5)_z$ is between $3 \times 10^{-2}$ to $1 \times 10^{-3} \Omega^{-1}$ cm$^{-1}$ as reported in Tsutomu Minami, Yakuni Takuma, and Masami Tanaka, *Superionic Conducting Glasses: Glass Formation and Conductivity in the AgI—$Ag_2O$—$P_2O_5$ System*, J. Electrochem. Soc.: ELECTROCHEMICAL SCIENCE AND TECHNOLOGY November 1977, herein incorporated by reference. The silver halide is typically about 0-90 wt. % of the total IRS, preferably about 0-60 wt. % of total IRS, even more preferably about 0-30 wt. % of IRS.

The silver containing glass composition may further comprise a zinc compound, preferably zinc oxide.

The silver halide matrix forming composition may be made by any process known to one skilled in the art. For example, silver halide and other components, in powder form, may be mixed together in a V-comb blender. The mixture may then be heated to about 580-620° C. for approximately 60 minutes, and then 780-820° C. for approximately 20 minutes.

This melting temperature range is much lower than traditional lead-containing glass frits, which are heated to about 800-1200° C., depending upon their composition. The glass is then quenched in deionized water, taking on a sand-like consistency. This coarse glass powder is then milled, such as in a ball mill or jet mill, until a fine powder results.

The silver halide may be incorporated in the IRS with additional oxide materials as a single matrix forming composition. The additional oxide materials may include Pb, Bi, Al, Ga, Si, Ge, Sn, B, P, Sb, Te, Nb, Ta, V, Ti, Mo, or W oxides. The additional oxide materials may between 20-95 wt. % of the IRS, more preferably 40-95 wt. %, and most preferably 50-95 wt. %. The additional oxide materials may be melted together with the silver halide and form an essentially uniform matrix forming composition.

The silver halide may be incorporated in the IRS with a second separate matrix forming composition. The second matrix forming compositions may be glass, ceramic, or any other compound known to one skilled in the art that can form a matrix at elevated temperature, and may comprise crystalline, partially crystalline or amorphous materials. The second matrix forming compositions may include Pb, Bi, Al, Ga, Si, Ge, Sn, B, P, Sb, Te, Nb, Ta, V, Ti, Mo, or W oxides. In this embodiment, the second matrix forming composition may be 5-95 wt. % of IRS, preferably 30-95 wt. %, and most preferably 40-95 wt. %.

In certain embodiments, the second matrix forming composition may comprise a lead containing glass composition. Alternatively, the second matrix forming composition may be "free of intentionally added lead." A composition that is "free of intentionally added lead" is one which is free of lead entirely, or has a lead oxide content of less than 0.5 wt. % based on total weight of glass (due to incidental impurities).

According to another embodiment of the invention, the IRS comprises a silver containing and a lead containing matrix forming composition. The silver containing matrix composition is typically about 0-95 wt. % of total IRS, preferably about 1-60 wt. % of the total IRS, more preferably about 5-50 wt. % of the total IRS. The lead matrix forming composition is typically about 5-95 wt. % of total IRS, preferably about 40-95 wt. % of the total IRS, more preferably about 50-95 wt. % of the total IRS.

The Lead Containing Matrix Composition

The lead containing matrix composition comprises lead oxide or other lead-based compounds including, but not limited to, salts of lead halides, lead chalcogenides, lead carbonate, lead sulfate, lead phosphate, lead nitrate and organometallic lead compounds or compounds that can form lead oxides or slats during thermal decomposition.

In one embodiment, the lead containing matrix composition comprises lead oxide. In certain embodiments, the lead containing matrix composition contains between about 10 and about 90 weight % lead oxide, such as between about 25 and about 85 weight %, between about 5 and about 45 weight % or between about 10 and about 15 weight %. In one embodiment, the lead containing matrix composition comprises about 80 weight % lead oxide.

In one embodiment, the lead containing matrix composition is a lead containing glass frit. In one embodiment, the lead containing glass frit is substantially amorphous. In another embodiment, the lead containing glass frit incorporates crystalline phases or compounds. In a further embodiment, the lead containing matrix composition may be a mixture of crystalline or amorphous lead oxide or compounds known to one skilled in the art.

The lead containing matrix composition may include other oxides or compounds known to one skilled in the art. For example, silicon, boron, aluminum, bismuth, lithium, sodium, magnesium, zinc, titanium, or zirconium oxides or compounds may be used. Other glass matrix formers or glass modifiers, such as germanium oxide, vanadium oxide, tungsten oxide, molybdenum oxides, niobium oxides, tin oxides, indium oxides, other alkaline and alkaline earth metal (such as K, Rb, Cs and Be, Ca, Sr, Ba) compounds, rare earth oxides (such as $La_2O_3$, cerium oxides), phosphorus oxides or metal phosphates, transition metal oxides (such as copper oxides and chromium oxides), or metal halides (such as lead fluorides and zinc fluorides) may also be part of the glass composition. In one embodiment of the present invention, lead free glass frits may comprise bismuth and other oxides, for example, without limiting the scope of the invention, bismuth-boron-lithium-oxide, bismuth-silicon-oxide, bismuth-silicon-zinc-boron-oxide or a bismuth-zinc-boron-oxide.

The lead matrix composition typically may be about 0-10 wt. % of the electroconductive paste composition.

Forming the Inorganic Reaction System

The matrix forming compositions or glass fits described herein can be made by any process known to one skilled in the art, by mixing appropriate amounts of powders of the individual ingredients, heating the powder mixture in air or in an oxygen-containing atmosphere to form a melt, quenching the melt, grinding and ball milling the quenched material and screening the milled material to provide a powder with the desired particle size. For example, glass frit components, in powder form, may be mixed together in a V-comb blender. The mixture is then heated (e.g., to around 800-1200° C.) for about 30-40 minutes. The glass is then quenched, taking on a sand-like consistency. This coarse glass powder is then milled, such as in a ball mill or jet mill, until a fine powder results. Typically, the inorganic reaction system may be milled to an average particle sized of 0.01-10 μm, preferably 0.1-5 μm.

In certain embodiments, part of the components, such as additives, may be blended and milled together to form the IRS without first incorporating into a glass frit. In other embodiments, IRS components may be formed into two or more glass fits, and then blended and milled together. The IRS may also be formed by blending and milling all components together without forming glass frits.

In another example, conventional solid state synthesis may be used to prepare the inorganic reaction systems described herein. In this case, raw materials are sealed in a fused-quartz tube or tantalum or platinum tube under vacuum, and then heated to about 700-1200° C. The materials dwell at this elevated temperature for about 12-48 hours and then are slowly cooled (about 0.1° C./minute) to room temperature. In some cases, solid state reactions may be carried out in an alumina crucible in air.

In another example, co-precipitation may be used to form the inorganic reaction systems. In this process, the metal elements are reduced and co-precipitated with other metal oxides or hydroxides to from a solution containing metal cations by adjusting the pH levels or by incorporating reducing agents. The precipitates of these metals, metal oxides or hydroxides are then dried and fired under vacuum at about 400-600° C. to form a fine powder.

The Electroconductive Paste Composition

The invention relates to an electroconductive paste composition. Preferred electroconductive pastes according to the invention are pastes which can be applied to a surface, and which, upon firing, form solid electrode bodies in electrical contact with that surface. The constituents of the paste and proportions thereof can be selected by the person skilled in the art such that the paste has the desired properties.

In one embodiment, the electroconductive paste composition comprises a conductive metal component, an inorganic reaction system (according to any of the embodiments described above), and an organic vehicle.

The Conductive Metal Component

Preferred metallic particles in the context of the invention are those which exhibit metallic conductivity or which yield a substance which exhibits metallic conductivity on firing. Metallic particles present in the electroconductive paste give metallic conductivity to the solid electrode which is formed when the electroconductive paste is sintered on firing. Metallic particles which favor effective sintering and yield electrodes with high conductivity and low contact resistance are preferred. Metallic particles are well known to the person skilled in the art. All metallic particles known to the person skilled in the art, and which are considered suitable in the context of the invention, may be employed as the metallic particles in the electroconductive paste. Preferred metallic particles according to the invention are metals, alloys, mixtures of at least two metals, mixtures of at least two alloys or mixtures of at least one metal with at least one alloy.

Preferred metals which may be employed as metallic particles according to the invention are Ag, Cu, Al, Zn, Pd, Ni or Pb and mixtures of at least two thereof, preferably Ag. Preferred alloys which may be employed as metallic particles according to the invention are alloys containing at least one metal selected from the list of Ag, Cu, Al, Zn, Ni, W, Pb and Pd or mixtures or two or more of those alloys.

In one embodiment according to the invention, the metallic particles comprise a metal or alloy coated with one or more different metals or alloys, for example copper coated with silver.

In a preferred embodiment, the metallic particles comprise Ag. In another embodiment, the metallic particles comprise a mixture of Ag with Al. The metallic particles may be present as elemental metal, one or more metal derivatives, or a mixture thereof. Suitable silver derivatives include, for example, silver alloys and/or silver salts, such as silver halides (e.g., silver chloride), silver nitrate, silver acetate, silver trifluoroacetate, silver orthophosphate, and combinations thereof.

As additional constituents of the metallic particles, further to above mentioned constituents, those constituents which contribute to more favorable sintering properties, electrical contact, adhesion and electrical conductivity of the formed electrodes are preferred according to the invention. All additional constituents known to the person skilled in the art, and which are considered to be suitable in the context of the invention, may be employed in the metallic particles. Those additional constituents which represent complementary dopants for the face to which the electroconductive paste is applied are preferred according to the invention. When forming an electrode interfacing with a p-type doped Si layer, additives capable of acting as p-type dopants in Si are preferred. Preferred p-type dopants are group 13 elements or compounds which yield such elements on firing. Preferred group 13 elements in this context according to the invention are B and Al.

It is well known to the person skilled in the art that metallic particles can exhibit a variety of shapes, surfaces, sizes, surface area to volume ratios, oxygen content and oxide layers. A large number of shapes are known to the person skilled in the art. Some examples are spherical, angular, elongated (rod or needle like) and flat (sheet like). Metallic particles may also be present as a combination of particles of different shapes. Metallic particles with a shape, or combination of shapes, which favors advantageous sintering, electrical contact, adhesion and electrical conductivity of the produced electrode are preferred according to the invention. One way to characterize such shapes without considering surface nature is through the following parameters: length, width and thickness. In the context of the invention, the length of a particle is given by the length of the longest spatial displacement vector, both endpoints of which are contained within the particle. The width of a particle is given by the length of the longest spatial displacement vector perpendicular to the length vector defined above both endpoints of which are contained within the particle. The thickness of a particle is given by the length of the longest spatial displacement vector perpendicular to both the length vector and the width vector, both defined above, both endpoints of which are contained within the particle.

In one embodiment according to the invention, metallic particles with shapes as uniform as possible are preferred (i.e. shapes in which the ratios relating the length, the width and the thickness are as close as possible to 1, preferably all ratios lying in a range from about 0.7 to about 1.5, more preferably in a range from about 0.8 to about 1.3 and most preferably in a range from about 0.9 to about 1.2). Examples of preferred shapes for the metallic particles in this embodiment are spheres and cubes, or combinations thereof, or combinations of one or more thereof with other shapes. In another embodiment according to the invention, metallic particles are preferred which have a shape of low uniformity, preferably with at least one of the ratios relating the dimensions of length, width and thickness being above about 1.5, more preferably above about 3 and most preferably above about 5. Preferred shapes according to this embodiment are flake shaped, rod or needle shaped, or a combination of flake shaped, rod or needle shaped with other shapes.

A variety of surface types are known to the person skilled in the art. Surface types which favor effective sintering and yield advantageous electrical contact and conductivity of produced electrodes are favored for the surface type of the metallic particles according to the invention.

Another way to characterize the shape and surface of a metallic particle is by its surface area to volume ratio. The lowest value for the surface area to volume ratio of a particle is embodied by a sphere with a smooth surface. The less uniform and uneven a shape is, the higher its surface area to volume ratio will be. In one embodiment according to the invention, metallic particles with a high surface area to volume ratio are preferred, preferably in a range from about $1.0 \times 10^7$ to about $1.0 \times 10^9$ m$^{-1}$, more preferably in a range from about $5.0 \times 10^7$ to about $5.0 \times 10^8$ m$^{-1}$ and most preferably in a range from about $1.0 \times 10^8$ to about $5.0 \times 10^8$ M$^{-1}$. In another embodiment according to the invention, metallic particles with a low surface area to volume ratio are preferred, preferably in a range from about $6 \times 10^5$ to about $8.0 \times 10^6$ m$^{-1}$, more preferably in a range from about $1.0 \times 10^6$ to about $6.0 \times 10^6$ m$^{-1}$ and most preferably in a range from about $2.0 \times 10^6$ to about $4.0 \times 10^6$ m$^{-1}$.

The particle diameter $d_{50}$ and the associated values, $d_{10}$ and $d_{90}$, are characteristics of particles well known to the person skilled in the art. It is preferred according to the invention that the average particle diameter $d_{50}$ of the metallic particles lie in a range from about 2 to about 4 µm, more preferably in a range from about 2.5 to about 3.5 µm and most preferably in a range from about 2.8 to about 3.2 µm. The determination of the particle diameter $d_{50}$ is well known to a person skilled in the art.

In one embodiment of the invention, the metallic particles have a $d_{10}$ greater than about 1.5 µm, preferably greater than about 1.7 µm, more preferably greater than about 1.9 µm. The value of $d_{10}$ should not exceed the value of $d_{50}$.

In one embodiment of the invention, the metallic particles have a $d_{90}$ less than about 6 µm, preferably less than about 5 µm, more preferably less than about 4.5 µm. The value of $d_{90}$ should not be less than the value of $d_{50}$.

The metallic particles may be present with a surface coating. Any such coating known to the person skilled in the art, and which is considered to be suitable in the context of the invention, may be employed on the metallic particles. Preferred coatings according to the invention are those coatings which promote improved printing, sintering and etching characteristics of the electroconductive paste. If such a coating is present, it is preferred according to the invention for that coating to correspond to no more than about 10 wt. %, preferably no more than about 8 wt. %, most preferably no more than about 5 wt. %, in each case based on the total weight of the metallic particles.

In one embodiment, the metallic particles are greater than about 50 wt. % (of paste), preferably greater than about 70 wt. %, and most preferably greater than about 80 wt. %.

The Organic Vehicle

Preferred organic vehicles in the context of the invention are solutions, emulsions or dispersions based on one or more solvents, preferably an organic solvent, which ensure that the constituents of the electroconductive paste are present in a dissolved, emulsified or dispersed form. Preferred organic vehicles are those which provide optimal stability of constituents within the electroconductive paste and endow the electroconductive paste with a viscosity allowing effective line printability.

In one embodiment, the organic vehicle comprises an organic solvent and one or more of a binder (e.g., a polymer), a surfactant or a thixotropic agent, or any combination thereof. For example, in one embodiment, the organic vehicle comprises one or more binders in an organic solvent.

Preferred binders in the context of the invention are those which contribute to the formation of an electroconductive paste with favorable stability, printability, viscosity, sintering and etching properties. Binders are well known to the person skilled in the art. All binders which are known to the person skilled in the art, and which are considered to be suitable in the context of this invention, can be employed as the binder in the organic vehicle. Preferred binders according to the invention (which often fall within the category termed "resins") are polymeric binders, monomeric binders, and binders which are a combination of polymers and monomers. Polymeric binders can also be copolymers wherein at least two different monomeric units are contained in a single molecule. Preferred polymeric binders are those which carry functional groups in the polymer main chain, those which carry functional groups off of the main chain and those which carry functional groups both within the main chain and off of the main chain. Preferred polymers carrying functional groups in the main chain are for example polyesters, substituted polyesters, polycarbonates, substituted polycarbonates, polymers which carry cyclic groups in the main chain, poly-sugars, substituted poly-sugars, polyurethanes, substituted polyurethanes, polyamides, substituted polyamides, phenolic resins, substituted phenolic resins, copolymers of the monomers of one or more of the preceding polymers, optionally with other co-monomers, or a combination of at least two thereof. Preferred polymers which carry cyclic groups in the main chain are for example polyvinylbutylate (PVB) and its derivatives and poly-terpineol and its derivatives or mixtures thereof. Preferred poly-sugars are for example cellulose and alkyl derivatives thereof, preferably methyl cellulose, ethyl cellulose, hydroxyethyl cellulose, propyl cellulose, hydroxypropyl cellulose, butyl cellulose and their derivatives and mixtures of at least two thereof. Preferred polymers which carry functional groups off of the main polymer chain are those which carry amide groups, those which carry acid and/or ester groups, often called acrylic resins, or polymers which carry a combination of aforementioned functional groups, or a combination thereof. Preferred polymers which carry amide off of the main chain are for example polyvinyl pyrrolidone (PVP) and its derivatives. Preferred polymers which carry acid and/or ester groups off of the main chain are for example polyacrylic acid and its derivatives, polymethacrylate (PMA) and its derivatives or polymethylmethacrylate (PMMA) and its derivatives, or a mixture thereof. Preferred monomeric binders according to the invention are ethylene glycol based monomers, terpineol resins or rosin derivatives, or a mixture thereof. Preferred monomeric binders based on ethylene glycol are those with ether groups, ester groups or those with an ether group and an ester group, preferred ether groups being methyl, ethyl, propyl, butyl, pentyl hexyl and higher alkyl ethers, the preferred ester group being acetate and its alkyl derivatives, preferably ethylene glycol monobutylether monoacetate or a mixture thereof. Alkyl cellulose, preferably ethyl cellulose, its derivatives and mixtures thereof with other binders from the preceding lists of binders or otherwise are the most preferred binders in the context of the invention. The binder may be present in an amount between about 0.1 and 10 wt. % of the organic vehicle, preferably between about 0.1-8 wt. %, more preferably between about 0.5-7 wt. %.

Preferred solvents according to the invention are constituents of the electroconductive paste which are removed from the paste to a significant extent during firing, preferably those which are present after firing with an absolute weight reduced by at least about 80% compared to before firing, preferably reduced by at least about 95% compared to before firing. Preferred solvents according to the invention are those which allow an electroconductive paste to be formed which has favorable viscosity, printability, stability and sintering characteristics and which yields electrodes with favorable electrical conductivity and electrical contact to the substrate. Solvents are well known to the person skilled in the art. All solvents which are known to the person skilled in the art, and which are considered to be suitable in the context of this invention, may be employed as the solvent in the organic vehicle. According to the invention, preferred solvents are those which allow the preferred high level of printability of the electroconductive paste as described above to be achieved. Preferred solvents according to the invention are those which exist as a liquid under standard ambient temperature and pressure (SATP) (298.15 K, 25° C., 77° F.), 100 kPa (14.504 psi, 0.986 atm), preferably those with a boiling point above about 90° C. and a melting point above about −20° C. Preferred solvents according to the invention are polar or non-polar, protic or aprotic, aromatic or non-aromatic. Preferred solvents according to the invention are mono-alcohols, di-alcohols, poly-alcohols, mono-esters, di-esters, poly-esters, mono-ethers, di-ethers, poly-ethers, solvents which comprise at least one or more of these categories of functional group, optionally comprising other categories of functional group, preferably cyclic groups, aromatic groups, unsaturated bonds, alcohol groups with one or more O atoms replaced by heteroatoms, ether groups with one or more O atoms replaced by heteroatoms, esters groups with one or more O atoms replaced by heteroatoms, and mixtures of two or more of the aforementioned solvents. Preferred esters in this context are di-alkyl esters of adipic acid, preferred alkyl constituents being methyl, ethyl, propyl, butyl, pentyl, hexyl and higher alkyl groups or combinations of two different such alkyl groups, preferably dimethyladipate, and mixtures of two or more adipate esters. Preferred ethers in this context are diethers, preferably dialkyl ethers of ethylene glycol, preferred alkyl constituents being methyl, ethyl, propyl, butyl, pentyl, hexyl and higher alkyl groups or combinations of two different such alkyl groups, and mixtures of two diethers. Preferred alcohols in this context are primary, secondary and tertiary alcohols, preferably tertiary alcohols, terpineol and its derivatives being preferred, or a mixture of two or more alcohols. Preferred solvents which combine more than one different functional groups are 2,2,4-trimethyl-1,3-pentanediol monoisobutyrate, often called texanol, and its derivatives, 2-(2-ethoxyethoxy)ethanol, often known as carbitol, its alkyl derivatives, preferably methyl, ethyl, propyl, butyl, pentyl, and hexyl carbitol, preferably hexyl carbitol or butyl carbitol, and acetate derivatives thereof, preferably butyl carbitol acetate, or mixtures of at least two of the aforementioned. The organic solvent may be present in an amount between about 40 and 90 wt. % of organic vehicle, more preferably between about 35 and 85 wt. % of organic vehicle.

The organic vehicle may also comprise a surfactant and/or additives. Preferred surfactants in the context of the invention are those which contribute to the formation of an electroconductive paste with favorable stability, printability, viscosity, sintering and etching properties. Surfactants are well known to the person skilled in the art. All surfactants which are known to the person skilled in the art, and which are considered to be suitable in the context of this invention, may be employed as the surfactant in the organic vehicle. Preferred surfactants in the context of the invention are those based on linear chains, branched chains, aromatic chains, fluorinated chains, siloxane chains, polyether chains and combinations thereof. Preferred surfactants are single chained, double chained or poly chained. Preferred surfactants according to the invention may have non-ionic, anionic, cationic, amphiphilic, or zwitterionic heads. Preferred surfactants are polymeric and monomeric or a mixture thereof. Preferred surfactants according to the invention can have pigment affinic groups, preferably hydroxyfunctional carboxylic acid esters with pigment affinic groups (e.g., DISPERBYK®-108, manufactured by BYK USA, Inc.), acrylate copolymers with pigment affinic groups (e.g., DISPERBYK®-116, manufactured by BYK USA, Inc.), modified polyethers with pigment affinic groups (e.g., TEGO® DISPERS 655, manufactured by Evonik Tego Chemie GmbH), other surfactants with groups of high pigment affinity (e.g., TEGO® DISPERS 662 C, manufactured by Evonik Tego Chemie GmbH). Other preferred polymers according to the invention not in the above list are polyethyleneglycol and its derivatives, and alkyl carboxylic acids and their derivatives or salts, or mixtures thereof. The preferred polyethyleneglycol derivative according to the invention is poly(ethyleneglycol)acetic acid. Preferred alkyl carboxylic acids are those with fully saturated and those with singly or poly unsaturated alkyl chains or mixtures thereof. Preferred carboxylic acids with saturated alkyl chains are those with alkyl chains lengths in a range from about 8 to about 20 carbon atoms, preferably $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) or mixtures thereof. Preferred carboxylic acids with unsaturated alkyl chains are $C_{18}H_{34}O_2$ (oleic acid) and $C_{18}H_{32}O_2$ (linoleic acid). The preferred monomeric surfactant according to the invention is benzotriazole and its derivatives. The surfactant may be present in an amount of about 0 to 10 weight % of organic vehicle, preferably about 0-8 wt. %, and more preferably about 0.01-6 wt. %.

Preferred additives in the organic vehicle are those additives which are distinct from the aforementioned vehicle components and which contribute to favorable properties of the electroconductive paste, such as advantageous viscosity, sintering, electrical conductivity of the produced electrode and good electrical contact with substrates. All additives known to the person skilled in the art, and which are considered to be suitable in the context of the invention, may be employed as additives in the organic vehicle. Preferred additives according to the invention are thixotropic agents, viscosity regulators, stabilizing agents, inorganic additives, thickeners, emulsifiers, dispersants or pH regulators. Preferred thixotropic agents in this context are carboxylic acid derivatives, preferably fatty acid derivatives or combinations thereof. Preferred fatty acid derivatives are $C_9H_{19}COOH$ (capric acid), $C_{11}H_{23}COOH$ (Lauric acid), $C_{13}H_{27}COOH$ (myristic acid) $C_{15}H_{31}COOH$ (palmitic acid), $C_{17}H_{35}COOH$ (stearic acid) $C_{18}H_{34}O_2$ (oleic acid), $C_{18}H_{32}O_2$ (linoleic acid) or combinations thereof. A preferred combination comprising fatty acids in this context is castor oil. In order to facilitate printability of the electroconductive paste, it is preferred according to the invention that the viscosity of the electroconductive paste lies in a range from about 10 to about 30 Pa·s, preferably in a range from about 12 to about 25 Pa·s and most preferably in a range from about 15 to about 22 Pa·s.

In one embodiment, the organic vehicle is present in an amount of about 5-40 weight % of paste, more preferably about 5-30 wt. %, and most preferably about 5-15 wt. %.

Additives

Preferred additives in the context of the invention are constituents added to the electroconductive paste, in addition to the other constituents explicitly mentioned, which contribute to increased performance of the electroconductive paste, of the electrodes produced thereof, or of the resulting solar cell. All additives known to the person skilled in the art, and which are considered suitable in the context of the invention, may be employed as additives in the electroconductive paste. In addition to additives present in the IRS and in the vehicle, additives can also be present in the electroconductive paste. Preferred additives according to the invention are thixotropic agents, viscosity regulators, emulsifiers, stabilizing agents or pH regulators, inorganic additives, thickeners and dispersants, or a combination of at least two thereof, whereas inorganic additives are most preferred. Preferred inorganic additives in this context according to the invention are Mg, Ni, Te, W, Zn, Mg, Gd, Ce, Zr, Ti, Mn, Sn, Ru, Co, Fe, Cu and Cr or a combination of at least two thereof, preferably Zn, Sb, Mn, Ni, W, Te and Ru, or a combination of at least two thereof, oxides thereof, compounds which can generate those metal oxides on firing, or a mixture of at least two of the aforementioned metals, a mixture of at least two of the aforementioned oxides, a mixture of at least two of the aforementioned compounds which can generate those metal oxides on firing, or mixtures of two or more of any of the above mentioned.

Forming the Electroconductive Paste Composition

To form the electroconductive paste composition, the inorganic reaction system materials may be combined with the conductive metal component (e.g., silver) and the organic vehicle using any method known in the art for preparing a paste composition. The method of preparation is not critical, as long as it results in a homogenously dispersed paste. The components can be mixed, such as with a mixer, then passed through a three roll mill, for example, to make a dispersed uniform paste. In addition to mixing all of the components simultaneously, the inorganic reaction system material can be co-milled with the conductive metallic component in a ball mill for 2-24 hours to achieve a homogenous mixture of the inorganic reaction system and conductive metallic component particles, which may then combined with the organic vehicle in a mixer.

Solar Cells

In another aspect, the invention relates to a solar cell. In one embodiment, the solar cell comprises a semiconductor substrate (e.g., a silicon wafer) and an electroconductive paste composition according to any of the embodiments described herein.

In another aspect, the invention relates to a solar cell prepared by a process comprising applying an electroconductive paste composition according to any of the embodiments described herein to a semiconductor substrate (such as a silicon wafer) and firing the semiconductor substrate.

Silicon Wafer

Preferred wafers according to the invention are regions, among other regions of the solar cell, capable of absorbing light with high efficiency to yield electron-hole pairs and separating holes and electrons across a boundary with high efficiency, preferably across a so called p-n junction boundary. Preferred wafers according to the invention are those comprising a single body made up of a front doped layer and a back doped layer.

It is preferred for that wafer to consist of appropriately doped tetravalent elements, binary compounds, tertiary compounds or alloys. Preferred tetravalent elements in this context are Si, Ge or Sn, preferably Si. Preferred binary compounds are combinations of two or more tetravalent elements, binary compounds of a group III element with a group V element, binary compounds of a group II element with a group VI element or binary compounds of a group IV element with a group VI element. Preferred combinations of tetravalent elements are combinations of two or more elements selected from Si, Ge, Sn or C, preferably SiC. The preferred binary compounds of a group III element with a group V element is GaAs. It is most preferred according to the invention for the wafer to be based on Si. Si, as the most preferred material for the wafer, is referred to explicitly throughout the rest of this application. Sections of the following text in which Si is explicitly mentioned also apply for the other wafer compositions described above.

Where the front doped layer and back doped layer of the wafer meet is the p-n junction boundary. In an n-type solar cell, the back doped layer is doped with electron donating n-type dopant and the front doped layer is doped with electron accepting or hole donating p-type dopant. In a p-type solar cell, the back doped layer is doped with p-type dopant and the front doped layer is doped with n-type dopant. It is preferred according to the invention to prepare a wafer with a p-n junction boundary by first providing a doped Si substrate and then applying a doped layer of the opposite type to one face of that substrate.

Doped Si substrates are well known to the person skilled in the art. The doped Si substrate can be prepared in any way known to the person skilled in the art and which he considers to be suitable in the context of the invention. Preferred sources of Si substrates according to the invention are monocrystalline Si, multi-crystalline Si, amorphous Si and upgraded metallurgical Si, mono-crystalline Si or multi-crystalline Si being most preferred. Doping to form the doped Si substrate can be carried out simultaneously by adding dopant during the preparation of the Si substrate or can be carried out in a subsequent step. Doping subsequent to the preparation of the Si substrate can be carried out for example by gas diffusion epitaxy. Doped Si substrates are also readily commercially available. According to the invention it is one option for the initial doping of the Si substrate to be carried out simultaneously to its formation by adding dopant to the Si mix.

According to the invention it is one option for the application of the front doped layer and the highly doped back layer, if present, to be carried out by gas-phase epitaxy. This gas phase epitaxy is preferably carried out at a temperature in a range from about 500° C. to about 900° C., more preferably in a range from about 600° C. to about 800° C. and most preferably in a range from about 650° C. to about 750° C. at a pressure in a range from about 2 kPa to about 100 kPa, preferably in a range from about 10 to about 80 kPa, most preferably in a range from about 30 to about 70 kPa.

It is known to the person skilled in the art that Si substrates can exhibit a number of shapes, surface textures and sizes. The shape can be one of a number of different shapes including cuboid, disc, wafer and irregular polyhedron amongst others. The preferred shape according to the invention is wafer shaped where that wafer is a cuboid with two dimensions which are similar, preferably equal and a third dimension which is significantly less than the other two dimensions. Significantly less in this context is preferably at least a factor of about 100 smaller.

A variety of surface types are known to the person skilled in the art. According to the invention Si substrates with rough surfaces are preferred. One way to assess the roughness of the substrate is to evaluate the surface roughness parameter for a sub-surface of the substrate which is small in comparison to the total surface area of the substrate, preferably less than about one hundredth of the total surface area, and which is essentially planar. The value of the surface roughness parameter is given by the ratio of the area of the subsurface to the area of a theoretical surface formed by projecting that subsurface onto the flat plane best fitted to the subsurface by minimizing mean square displacement. A higher value of the surface roughness parameter indicates a rougher, more irregular surface and a lower value of the surface roughness parameter indicates a smoother, more even surface. According to the invention, the surface roughness of the Si substrate is preferably modified so as to produce an optimum balance between a number of factors including but not limited to light absorption and adhesion of fingers to the surface.

The two larger dimensions of the Si substrate can be varied to suit the application required of the resultant solar cell. It is preferred according to the invention for the thickness of the Si wafer to lie below about 0.5 mm more preferably below about 0.3 mm and most preferably below about 0.2 mm. Some wafers have a minimum size of 0.01 mm or more.

It is preferred according to the invention for the front doped layer to be thin in comparison to the back doped layer. It is preferred according to the invention for the front doped layer to have a thickness lying in a range from about 0.1 to about 10 µm, preferably in a range from about 0.1 to about 5 µm and most preferably in a range from about 0.1 to about 2 µm.

A highly doped layer can be applied to the back face of the Si substrate between the back doped layer and any further layers. Such a highly doped layer is of the same doping type as the back doped layer and such a layer is commonly denoted with a+ (n+-type layers are applied to n-type back doped layers and p+-type layers are applied to p-type back doped layers). This highly doped back layer serves to assist metallization and improve electroconductive proper-ties at the substrate/electrode interface area. It is preferred according to the invention for the highly doped back layer, if present, to have a thickness in a range from about 1 to about 100 µm, preferably in a range from about 1 to about 50 µm and most preferably in a range from about 1 to about 15 µm.

Dopants

Preferred dopants are those which, when added to the Si wafer, form a p-n junction boundary by introducing electrons or holes into the band structure. It is preferred according to the invention that the identity and concentration of these dopants is specifically selected so as to tune the band structure profile of the p-n junction and set the light absorption and conductivity pro-files as required. Preferred p-type dopants according to the invention are those which add holes to the Si wafer band structure. They are well known to the person skilled in the art. All dopants known to the person skilled in the art and which he considers to be suitable in the context of the invention can be employed as p-type dopant. Preferred p-type dopants according to the invention are trivalent elements, particularly those of group 13 of the periodic table. Preferred group 13 elements of the periodic table in this context include but are not limited to B, Al, Ga, In, Tl or a combination of at least two thereof, wherein B is particularly preferred.

Preferred n-type dopants according to the invention are those which add electrons to the Si wafer band structure. They are well known to the person skilled in the art. All dopants known to the person skilled in the art and which he considers to be suitable in the context of the invention can be employed as n-type dopant. Preferred n-type dopants according to the invention are elements of group 15 of the periodic table. Preferred group 15 elements of the periodic table in this context include N, P, As, Sb, Bi or a combination of at least two thereof, wherein P is particularly preferred.

As described above, the various doping levels of the p-n junction can be varied so as to tune the desired properties of the resulting solar cell.

In certain embodiments, the semiconductor substrate (i.e., silicon wafer) exhibits a sheet resistance above about $6\Omega/\square$, such as above about $65\Omega/\square$, above about $7\Omega/\square$, above about $9\Omega/\square$ or above about $95\Omega/\square$.

Solar Cells

A contribution to achieving at least one of the above described objects is made by a solar cell obtainable by a process according to the invention. Preferred solar cells according to the invention are those which have a high efficiency in terms of proportion of total energy of incident light converted into electrical energy output and which are light and durable.

Figure 2:
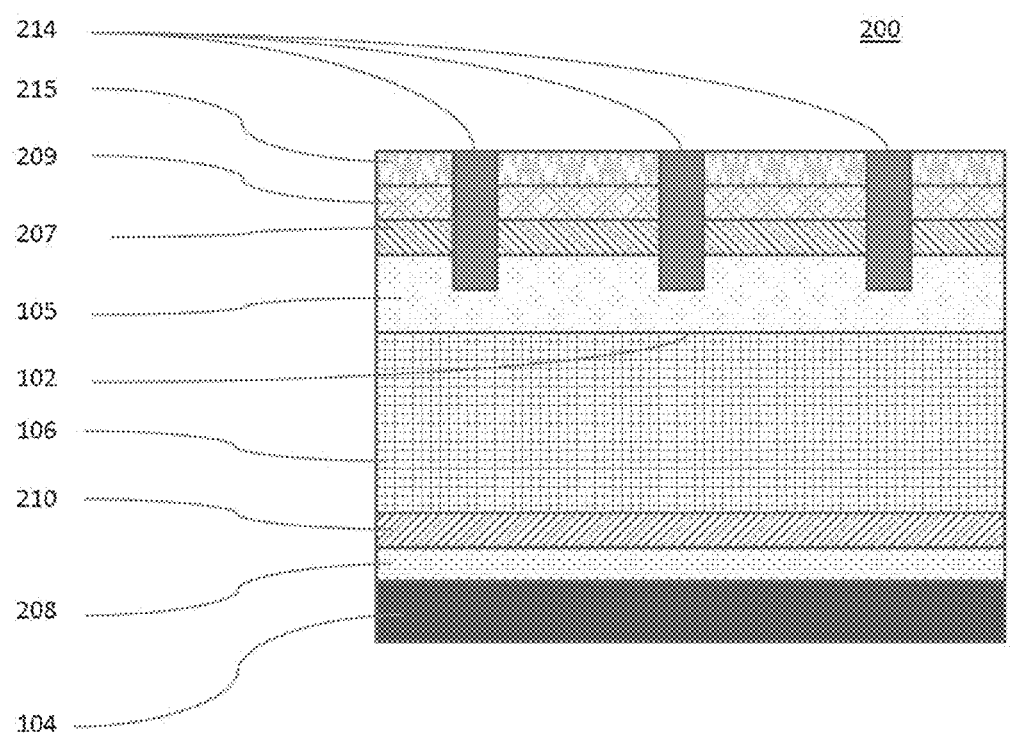
FIG. 2 is a cross-sectional end view of the solar cell of FIG. 1, including front and back doped and passivation layers and an anti-reflection layer.

The common configuration of a solar cell according to the invention (excluding layers which are purely for chemical and mechanical protection) is as depicted in FIG. 2. As depicted in FIG. 2, the solar cell 200 comprises a back electrode 104, a back passivation layer 208, a highly doped back layer 210, a back doped layer 106, a p-n junction boundary 102, a front doped layer 105, a front passivation layer 207, an anti-reflection layer 209, front electrode fingers 214 and front electrode bus bars 215, wherein the front electrode fingers penetrate through the anti-reflection layer 209 and the front passivation layer 207, into the front doped layer 105, far enough to form electrical contact with the front doped layer 105, but not so far as to shunt the p-n junction boundary 102. Individual layers can be omitted from this common layer configuration or individual layers can indeed perform the function of more than one of the layers described in the common embodiment outlined above. In one embodiment of the invention, a single layer acts as both antireflective layer and passivation layer.

The minimum required layer configuration is given in FIG. 1. The solar cell 100, at a minimum, comprises a back electrode 104, a back-doped layer 106, a p-n junction boundary 102, a front-doped layer 105 and front electrodes 103, wherein the front electrodes penetrate into the front-doped layer 105 enough to form electrical contact therewith. The back doped layer 106 and the front doped layer 105 together constitute a single doped Si wafer 101. In the case that solar cell 100 represents a p-type cell, the back electrode 104 is preferably a mixed silver and aluminium electrode, the back doped layer 106 is preferably Si lightly doped with boron, the front doped layer 105 is preferably Si-heavily doped with phosphorus, and the front electrode 103 is preferably a silver electrode. The front electrode 103 has been represented in FIG. 1 as consisting of three bodies purely to illustrate schematically the fact that the front electrode 103 does not cover the front face in its entirety. The invention does not limit the front electrode 103 to those consisting of three bodies.

Antireflective Layer

According to the invention, an antireflective layer can be applied as the outer layer before the electrode is applied to the front face of the solar cell. Preferred antireflective layers according to the invention are those which decrease the proportion of incident light reflected by the front face and increase the proportion of incident light crossing the front face to be absorbed by the wafer. Antireflective layers which give rise to a favourable absorption/reflection ratio, are susceptible to etching by the employed electroconductive paste but are otherwise resistant to the temperatures required for firing of the electroconductive paste, and do not contribute to increased recombination of electrons and holes in the vicinity of the electrode interface are favoured. All antireflective layers known to the person skilled in the art and which he considers to be suitable in the context of the invention can be employed. Preferred antireflective layers according to the invention are $SiN_x$, $SiO_2$, $Al_2O_3$, $TiO_2$ or mixtures of at least two thereof and/or combinations of at least two layers thereof, wherein $SiN_X$ is particularly preferred, in particular where an Si wafer is employed.

The thickness of antireflective layers is suited to the wavelength of the appropriate light. According to the invention it is preferred for antireflective layers to have a thickness in a range from about 20 to about 300 nm, more preferably in a range from about 40 to about 200 nm and most preferably in a range from about 60 to about 90 nm.

Passivation Layers

According to the invention, one or more passivation layers can be applied to the front and/or back side of the silicon wafer as an outer layer, before the electrode, or before the anti-reflection layer if one is present, is applied. Preferred passivation layers are those which reduce the rate of electron/hole recombination in the vicinity of the electrode interface. Any passivation layer which is known to the person skilled in the art and which he considers to be suitable in the context of the invention can be employed. Preferred passivation layers according to the invention are silicon nitride, silicon dioxide and titanium dioxide, silicon nitride being most preferred. According to the invention, it is preferred for the passivation layer to have a thickness in a range from about 0.1 nm to about 2 µm, more preferably in a range from about 10 nm to about 1 µm and most preferably in a range from about 30 nm to about 200 nm.

Additional Protective Layers

In addition to the layers described above which directly contribute to the principle function of the solar cell, further layers can be added for mechanical and chemical protection.

The cell can be encapsulated to provide chemical protection. Encapsulations are well known to the person skilled in the art and any encapsulation can be employed which is known to him and which he considers suitable in the context of the invention. According to the invention, transparent polymers, often referred to as transparent thermoplastic resins, are preferred as the encapsulation material, if such an encapsulation is present. Preferred transparent polymers in this context are for example silicon rubber and polyethylene vinyl acetate (PVA).

A transparent glass sheet can be added to the front of the solar cell to provide mechanical protection to the front face of the cell. Transparent glass sheets are well known to the person skilled in the art and any transparent glass sheet known to him and which he considers to be suitable in the context of the invention can be employed as protection on the front face of the solar cell.

A back protecting material can be added to the back face of the solar cell to provide mechanical protection. Back protecting materials are well known to the person skilled in the art and any back protecting material which is known to the person skilled in the art and which he considers to be suitable in the context of the invention can be employed as protection on the back face of the solar cell. Preferred back protecting materials according to the invention are those having good mechanical properties and weather resistance. The preferred back protection material according to the invention is polyethylene terephthalate with a layer of polyvinyl fluoride. It is preferred according to the invention for the back protecting material to be present underneath the encapsulation layer (in the event that both a back protection layer and encapsulation are present).

A frame material can be added to the outside of the solar cell to give mechanical support. Frame materials are well known to the person skilled in the art and any frame material known to the person skilled in the art and which he considers suitable in the context of the invention can be employed as frame material. The preferred frame material according to the invention is aluminium.

Method of Preparing Solar Cell

In one embodiment, the solar cell may be prepared by applying an electroconductive paste composition to an anti-reflective coating (ARC), such as silicon nitride, silicon oxide, titanium oxide or aluminum oxide, on a semiconductor substrate, such as a silicon wafer (e.g., by a screen printing process), then firing the semiconductor substrate to form an electrode on the substrate.

In one embodiment, the electroconductive paste is applied to the light receiving surface of the semiconductor substrate (e.g., silicon wafer). However, the foregoing does not preclude incorporating an inorganic reaction system in an electroconductive paste composition intended for the backside of a silicon wafer. The electroconductive paste can be applied in any manner known to the person skilled in that art and which he considers suitable in the context of the invention including but not limited to impregnation, dipping, pouring, dripping on, injection, spraying, knife coating, curtain coating, brushing or printing or a combination of at least two thereof, wherein preferred printing techniques are ink jet printing, screen printing, tampon printing, offset printing, relief printing or stencil printing or a combination of at least two thereof. It is preferred according to the invention that the electroconductive paste is applied by printing, preferably by screen printing. It is preferred according to the invention that the screens have mesh opening with a diameter in a range from about 20 to about 100 µm, more preferably in a range from about 30 to about 80 µm, and most preferably in a range from about 40 to about 70 µm.

It is preferred according to the invention for electrodes to be formed by first applying an electroconductive paste and then firing said electroconductive paste to yield a solid electrode body. Firing is well known to the person skilled in the art and can be effected in any manner known, and which is considered suitable in the context of the invention. It is preferred in the context of the invention that firing be carried out above the glass transition temperature of the IRS materials.

According to the invention, the maximum temperature set for the firing is below about 900° C., preferably below about 860° C. Firing temperatures as low as about 820° C. have been employed for obtaining solar cells. The firing temperature profile is typically set so as to enable the burnout of organic binder materials from the electroconductive paste composition, as well as any other organic materials present. The firing step is typically carried out in air or in an oxygen-containing atmosphere in a belt furnace. It is preferred according to the invention for firing to be carried out in a fast firing process with a total firing time in the range from about 30 s to about 3 minutes, more preferably in the range from about 30 s to about 2 minutes and most preferably in the range from about 40 seconds to about 1 minute. The time above 600° C. is most preferably in a range from about 3 to 7 seconds. The substrate may reach a peak temperature in the range of about 700 to 900° C. for a period of about 1 to 5 seconds. The firing may also be conducted at high transport rates, for example, about 100-500 cm/min, with resulting hold-up times of about 0.05 to 5 minutes. Multiple temperature zones, for example 3-11 zones, can be used to control the desired thermal profile.

Firing of electroconductive pastes on the front and back faces can be carried out simultaneously or sequentially. Simultaneous firing is appropriate if the electroconductive pastes applied to both faces have similar, preferably identical, optimum firing conditions. Where appropriate, it is preferred according to the invention for firing to be carried out simultaneously. Where firing is carried out sequentially, it is preferable according to the invention for the back electroconductive paste to be applied and fired first, followed by application and firing of the electroconductive paste to the front face.

Figure 3A:
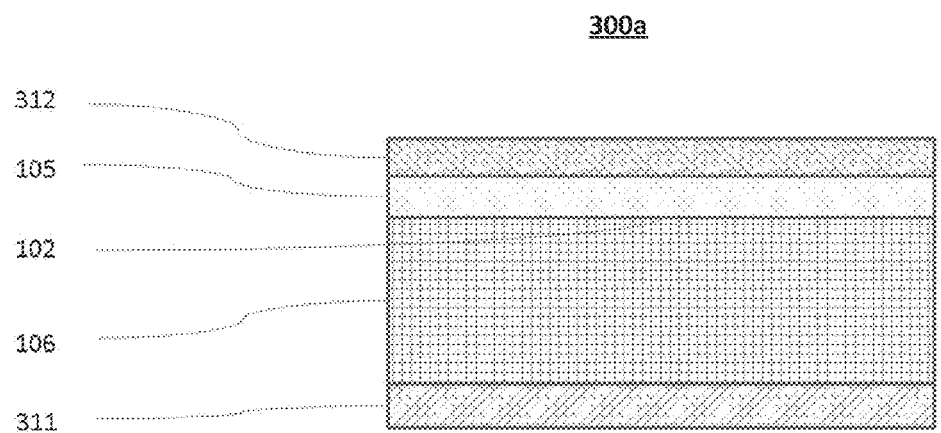
FIG. 3A is a cross sectional end view of a solar cell in accordance with an exemplary embodiment of the present invention, before application of a front electrode.
Figure 3B:
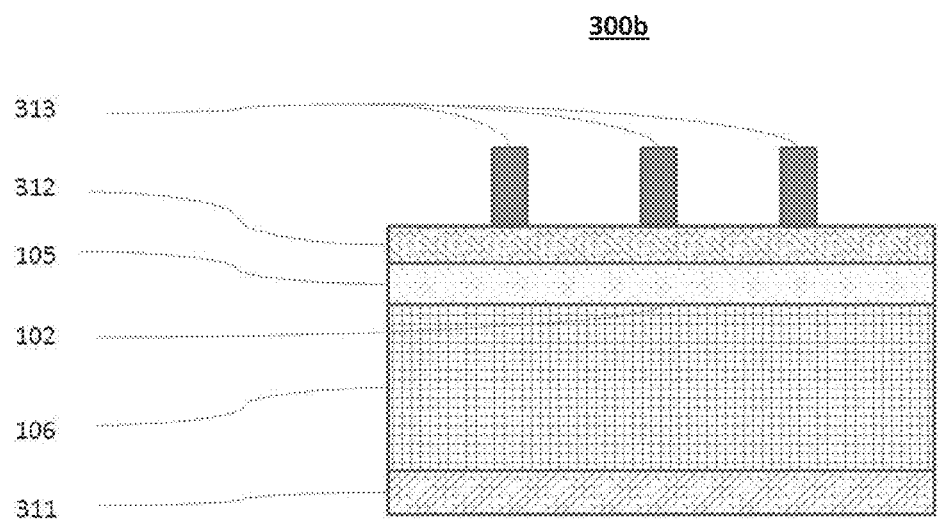
FIG. 3B is a cross-sectional end view of the solar cell of FIG. 3A, including an electroconductive paste according to an exemplary embodiment of the present invention printed thereon.
Figure 3C:
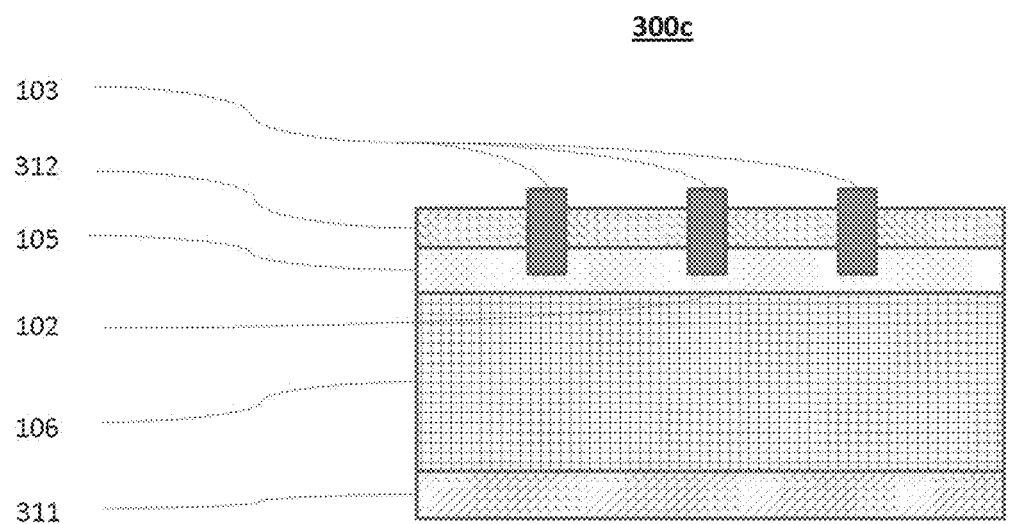
FIG. 3C is a cross-sectional end view of the solar cell of FIG. 3B, wherein the electroconductive paste has been fired to form a front electrode.

FIGS. 3A, 3B and 3C together illustrate the process of firing a front side paste to yield a front side electrode. FIGS. 3A, 3B and 3C are schematic and generalized and additional layers further to those constituting the p-n junction are considered simply as optional additional layers without more detailed consideration.

FIG. 3A illustrates a wafer before application of front electrode, 300a. Starting from the back face and continuing towards the front face the wafer before application of front electrode 300a optionally comprises additional layers on the back face 311, a back doped layer 106, a p-n junction boundary 102, a front doped layer 105 and additional layers on the front face 312. The additional layers on the back face 311 can comprise any of a back electrode, a back passivation layer, a highly doped back layer or none of the above. The additional layer on the front face 312 can comprise any of a front passivation layer, an anti-reflection layer or none of the above.

FIG. 3B shows a wafer with electroconductive paste applied to the front face before firing 300b. In addition to the layers present in 300a described above, an electroconductive paste 313 is present on the surface of the front face.

FIG. 3C shows a wafer with front electrode applied 300c. In addition to the layers present in 300a described above, a front side electrode 103 is present which penetrates from the surface of the front face through the additional front layers 312 and into the front doped layer 105 and is formed from the electroconductive paste 313 of FIG. 3B by firing.

In FIGS. 3B and 3C, the applied electroconductive paste 313 and the front electrodes 103 are shown schematically as being present as three bodies. This is purely a schematic way of representing a non-complete coverage of the front face by the paste/electrodes and the invention does not limit the paste/electrodes to being present as three bodies.

Solar Cell Module

A contribution to achieving at least one of the above mentioned objects is made by a module comprising at least one solar cell obtained as described above, in particular according to at least one of the above described embodiments. A multiplicity of solar cells according to the invention can be arranged spatially and electrically connected to form a collective arrangement called a module. Preferred modules according to the invention can take a number of forms, preferably a rectangular surface known as a solar panel. A large variety of ways to electrically connect solar cells, as well as a large variety of ways to mechanically arrange and fix such cells to form collective arrangements, are well known to the person skilled in the art. Any such methods known by one skilled in the art, and which are considered suitable in the context of the invention, may be employed. Preferred methods according to the invention are those which result in a low mass to power output ratio, low volume to power output ration, and high durability. Aluminum is the preferred material for mechanical fixing of solar cells according to the invention.

EXAMPLE 1

As shown in Table 2, three exemplary electroconductive pastes were prepared (Pastes A-C). Pastes A and B were prepared with an IRS comprising (in wt. % of paste) about 2.5 wt. % of a lead containing glass composition (glass having about 80 wt. % PbO), and about 1 wt. % of a tellurium oxide composition. Particularly, Exemplary Paste A comprises $TeO_2$—$B_2O_3$ (having 93% $TeO_2$, 7% $B_2O_3$), and Exemplary Paste B comprises amorphous $TeO_2$.

Paste C was prepared with an IRS comprising about 2.5 wt. % of the same lead containing glass composition, and about 1 wt. % of paste of an ATZ oxide glass (first matrix forming composition). Particularly, Exemplary Paste C comprises $Ag_2O$—$TeO_2$—$ZnO$ (having 2.5% $Ag_2O$, 80% $TeO_2$, 15% ZnO, and about 2.5% $Na_2O$ as additive).

Silver particles, in an amount of about 85 wt. % of paste, and an organic vehicle, in an amount of about 11-12 wt. % of paste, were added to each of Pastes A-C. Exemplary solar cells were prepared using lightly-doped p-type multicrystalline silicon wafers with a sheet resistance of 80Ω/□ ("Wafer 1").

TABLE 2

Composition of Exemplary Pastes A-C

| | Components | Paste A | Paste B | Paste C |
|---|---|---|---|---|
| IRS | Lead Glass (80 wt. % PbO) | 2.5 | 2.5 | 2.5 |
| | $TeO_2$—$B_2O_3$ (wt. %) | 1.0 | | |
| | Amorphous $TeO_2$ (wt. %) | | 1.0 | |
| | ATZ Oxide | | | 1.0 |
| Silver | | 85 | 85 | 85 |
| Organic Vehicle | | 11.5 | 11.5 | 11.5 |

The pastes were screen printed onto the front side of silicon wafers at a speed of 150 mm/s, using a 325 (mesh)*0.9 (mil, wire diameter)*0.6 (mil, emulsion thickness)*70 μm (finger line opening) calendar screen. An aluminum back side paste was also applied to the back side of the silicon wafer. The printed wafer was dried at 150° C. and then fired at a profile with the peak temperature of about 750-900° C. for a few seconds in a linear multi-zone infrared furnace.

All solar cells were then tested using a commercial I-V tester (cetisPV-CTL1 from Halm Elektronik GmbH). All parts of the measurement equipment, as well as the solar cell to be tested, were maintained at 25° C. during electrical measurement. This temperature is always measured simultaneously on the cell surface during the actual measurement by a temperature probe. The Xe Arc lamp simulates the sunlight with a known AM1.5 intensity of 1000 W/m² on the cell surface. To bring the simulator to this intensity, the lamp is flashed several times within a short period of time until it reaches a stable level monitored by the "PVCTControl 4.313.0" software of the IV-tester. The Halm IV tester uses a multi-point contact method to measure current (I) and voltage (V) to determine the cell's IV-curve. To do so, the solar cell is placed between the multi-point contact probes in such a way that the probe fingers are in contact with the bus bars of the cell. The numbers of contact probe lines are adjusted to the number of bus bars on the cell surface. All electrical values were determined directly from this curve automatically by the implemented software package. At least five wafers processed in the very same way are measured and the data interpreted by calculating the average of each value. The software PVCTControl 4.313.0 provides values for efficiency (Eta %), fill factor (FF, %), and series resistance under three standard lighting intensities (Rs3, mΩ).

Generally, the smaller the Rs3, the better contact behavior for the silver pastes, and the higher the efficiency and fill factor. Selected electrical performance data for Exemplary Pastes A-C is compiled in Tables 3 and 4. Data for Paste A and Paste B (the pastes without ATZ oxide) was normalized to 1. The relevant data for Paste C was calculated by dividing the appropriate measurement by the normalized reference cell data.

TABLE 3

Electrical Performance of Exemplary Pastes A and C on Wafer 1

| | Paste A | Paste C |
|---|---|---|
| Eta (%) | 1.000 | 1.041 |
| FF (%) | 1.000 | 1.032 |
| Rs3 (mΩ) | 1.000 | 0.687 |

TABLE 4

Electrical Performance of Exemplary Pastes B and C on Wafer 1

| | Paste B | Paste C |
|---|---|---|
| Eta (%) | 1.000 | 1.004 |
| FF (%) | 1.000 | 1.013 |
| Rs3 (mΩ) | 1.000 | 0.848 |

It is clear from the data presented in Tables 3 and 4 that Paste C (the only paste comprising the ATZ oxide glass) decreases serial resistance, as shown by the significant reduction of the Rs3 measurement as compared to those pastes not comprising the ATZ oxide. Paste C also exhibited increased solar cell efficiency and fill factor gain.

The same Pastes A-C were also printed on lightly-doped p-type multicrystalline silicon wafers with higher sheet resistances, namely 90Ω/□ and 120Ω/□ ("Wafer 2" and "Wafer 3", respectively). The electrical performance of Pastes A-C on these wafers was measured according to the parameters set forth in Example 1. Electrical data from these tests is set forth in Tables 5-8 below. As it can be seen, the ATZ oxide paste (Paste C) performed better than the non-ATZ oxide pastes (Pastes A and B) on Wafer 2 and Wafer 3.

TABLE 5

Electrical Performance of Exemplary Pastes A and C on Wafer 2

|  | Paste A | Paste C |
|---|---|---|
| Eta (%) | 1.000 | 1.009 |
| FF (%) | 1.000 | 1.011 |
| Rs3 (mΩ) | 1.000 | 0.835 |

TABLE 6

Electrical Performance of Exemplary Pastes B and C on Wafer 2

|  | Paste B | Paste C |
|---|---|---|
| Eta (%) | 1.000 | 1.006 |
| FF (%) | 1.000 | 1.007 |
| Rs3 (mΩ) | 1.000 | 0.878 |

TABLE 7

Electrical Performance of Exemplary Pastes A and C on Wafer 3

|  | Paste A | Paste C |
|---|---|---|
| Eta (%) | 1.000 | 1.298 |
| FF (%) | 1.000 | 1.276 |
| Rs3 (mΩ) | 1.000 | 0.374 |

TABLE 8

Electrical Performance of Exemplary Pastes B and C on Wafer 3

|  | Paste B | Paste C |
|---|---|---|
| Eta (%) | 1.000 | 1.132 |
| FF (%) | 1.000 | 1.124 |
| Rs3 (mΩ) | 1.000 | 0.555 |

EXAMPLE 2

Three exemplary electroconductive pastes were prepared (Pastes D-F). Pastes D and E are the same as Pastes A and B (Example 1), respectively, except that Pastes D and E comprise a different organic vehicle formulation. Paste F comprising the same inorganic compositions as Paste C. Exemplary solar cells were prepared using lightly-doped p-type multicrystalline silicon wafers with a sheet resistance of 82Ω/□ ("Wafer 4").

The pastes were screen printed, dried and fired according to the parameters set forth in Example 1. All solar cells were then tested according to the same method as set forth in Example 1. Selected electrical performance data for Exemplary Pastes D-F is compiled in Tables 9-10. Data for Pastes D and E (the pastes without ATZ oxide) was normalized to 1. The relevant data for Paste F was calculated by dividing the appropriate measurement by the normalized reference cell data.

TABLE 9

Electrical Performance of Exemplary Pastes D and F on Wafer 4

|  | Paste D | Paste F |
|---|---|---|
| Eta (%) | 1.000 | 1.003 |
| FF (%) | 1.000 | 1.001 |
| Rs3 (mΩ) | 1.000 | 0.975 |

TABLE 10

Electrical Performance of Exemplary Pastes E and F on Wafer 4

|  | Paste E | Paste F |
|---|---|---|
| Eta (%) | 1.000 | 1.008 |
| FF (%) | 1.000 | 1.002 |
| Rs3 (mΩ) | 1.000 | 0.969 |

It is clear from the data presented in Tables 9-10 that Paste F (the only paste comprising the ATZ oxide glass) decreases serial resistance, as shown by the reduction of the Rs3 measurement as compared to those pastes not comprising the ATZ oxide. Paste F also exhibited increased solar cell efficiency and fill factor gain.

The same Pastes D-F were also printed on lightly-doped p-type multicrystalline silicon wafers with a lower sheet resistance of 70Ω/□ ("Wafer 5"). The electrical performance of these pastes on these wafers was measured according to the parameters set forth in Example 1. Electrical data from these tests is set forth in Tables 11-12 below. As it can be seen, the ATZ oxide paste (Paste F) performed better than the non-ATZ oxide pastes (Pastes D and E) on this type of wafer as well.

TABLE 11

Electrical Performance of Exemplary Pastes D and F on Wafer 5

|  | Paste D | Paste F |
|---|---|---|
| Eta (%) | 1.000 | 1.002 |
| FF (%) | 1.000 | 1.002 |
| Rs3 (mΩ) | 1.000 | 0.970 |

TABLE 12

Electrical Performance of Exemplary Pastes E and F on Wafer 5

|  | Paste E | Paste F |
|---|---|---|
| Eta (%) | 1.000 | 1.006 |
| FF (%) | 1.000 | 1.008 |
| Rs3 (mΩ) | 1.000 | 0.892 |

EXAMPLE 3

As shown in Table 13, an exemplary electroconductive paste was prepared (Paste G). Paste G was prepared with an IRS comprising (in wt. % of paste) about 2.5 wt. % of paste of a lead containing glass composition (glass having about 80 wt. % of PbO) and about 1.2 wt. % of an ATZ oxide glass composition. The only difference between Paste C and Paste G is the amount of ATZ oxide in the total paste composition.

Silver particles, in an amount of about 85 wt. % of paste, and an organic vehicle, in an amount of slightly over 11 wt. % of paste, were added to Paste G. Exemplary solar cells were prepared using Wafer 2 and lightly-doped p-type multicrystalline silicon wafers with a sheet resistance of 75Ω/□ ("Wafer 6").

TABLE 13

Composition of Exemplary Paste G

| Components | | Paste G |
|---|---|---|
| IRS | Lead Glass (80 PbO wt. %) | 2.5 |
| | ATZ Oxide | 1.2 |
| Silver | | 85 |
| Organic Vehicle | | 11.3 |

The paste was screen printed, dried and fired according to the parameters set forth in Example 1. All solar cells were then tested according to the same method as set forth in Example 1. In Table 14, the electrical performance of Paste G was compared to that of Paste A (Example 1, no ATZ oxide) on Wafer 2. In Table 15, the electrical performance of Paste G was compared to that of Paste E (Example 2, no ATZ oxide) on Wafer 6. Data for Pastes A and E (the pastes without ATZ oxide) was normalized to 1. The relevant data for Paste G was calculated by dividing the appropriate measurement by the normalized reference cell data.

TABLE 14

Electrical Performance of Exemplary Pastes A and G on Wafer 2

| | Paste A | Paste G |
|---|---|---|
| Eta (%) | 1.000 | 1.009 |
| FF (%) | 1.000 | 1.003 |
| Rs3 (mΩ) | 1.000 | 0.946 |

TABLE 15

Electrical Performance of Exemplary Pastes E and G on Wafer 6

| | Paste E | Paste G |
|---|---|---|
| Eta (%) | 1.000 | 1.132 |
| FF (%) | 1.000 | 1.124 |
| Rs3 (mΩ) | 1.000 | 0.555 |

It is clear from the data presented in Tables 14 and 15 that Paste G exhibits decreased serial resistance, as shown by the reduction of the Rs3 measurement as compared to Pastes A and E. Paste G also exhibited increased solar cell efficiency and fill factor gain compared to Pastes A and E.

EXAMPLE 4

As shown in Table 16, two exemplary electroconductive pastes were prepared (Paste C2 and C3). Pastes C2 and C3 were prepared with an IRS comprising (in wt. % of paste) about 2.5 wt. % of paste of a lead containing glass composition (glass having about 80 wt. % of PbO) and about 1 wt. % of an ATZ oxide glass composition. Pastes C2 and C3 differ from Paste C (Example 1) in that they were prepared with an ATZ oxide glass composition having different amounts of the individual components. Specifically, Paste C2 comprises an ATZ oxide composition having about 3.6% $Ag_2O$, about 14.4% ZnO, about 80% $TeO_2$, and about 2% $Na_2O$ as additive. Paste C3 comprises an ATZ oxide composition having about 7% $Ag_2O$, about 14% ZnO, and about 79% $TeO_2$.

Silver particles, in an amount of about 85 wt. % of paste, and an organic vehicle, in an amount of about 11.5 wt. % of paste, were added to Pastes C2 and C3. Exemplary solar cells were prepared using lightly-doped p-type multicrystalline silicon wafers with a sheet resistance of 65Ω/□ ("Wafer 7").

TABLE 16

Composition of Exemplary Paste C2

| Components | | Paste C2 | Paste C3 |
|---|---|---|---|
| IRS | Lead Glass (80 PbO wt. %) | 2.5 | 2.5 |
| | ATZ Oxide | 1 | 1 |
| Silver | | 85 | 85 |
| Organic Vehicle | | 11.5 | 11.5 |

The paste was screen printed, dried and fired according to the parameters set forth in Example 1. All solar cells were then tested according to the same method as set forth in Example 1. In Table 17, the electrical performance of Paste C2 and Paste C3 was compared to that of Paste C (Example 1, different ATZ oxide components) on Wafer 7. The relevant data for Paste C2 and C3 was calculated by dividing the appropriate measurement by the normalized reference cell data.

TABLE 17

Electrical Performance of Exemplary Pastes C2 and C3 on Wafer 7

| | Paste C | Paste C2 | Paste C3 |
|---|---|---|---|
| Eta (%) | 1.00 | 0.99 | 1.00 |
| FF (%) | 1.00 | 1.02 | 1.02 |
| Rs3 (mΩ) | 1.00 | 0.73 | 0.76 |

It is clear from the data presented in Table 17 that Pastes C2 and C3 (having larger amounts of $Ag_2O$ as compared to Paste C) exhibit comparable efficiency and fill factor as compared to Paste C, while both exhibit decreased series resistance.

EXAMPLE 5

As shown in Table 18, four exemplary electroconductive pastes were prepared (Pastes H-K). Paste H was prepared with an IRS comprising (in wt. % of IRS) about 64.2 wt. % of a lead containing glass composition (glass having about 80 wt. % PbO), and about 35.8 wt. % of a tellurium oxide composition. These two components were incorporated separately into the IRS. Particularly, Exemplary Paste H comprises $TeO_2$—$Ag_2O$ in a ratio of about 58:42. The IRS was about 2.5-4 wt. % of Paste H.

Exemplary Pastes I-K were prepared with an IRS comprising varying amounts of the same lead containing glass composition, varying amounts of the same tellurium oxide composition, and varying amounts of a silver halide. Particularly, Exemplary Pastes I-K comprise silver iodide. The silver iodide was incorporated within the tellurium oxide composition. The IRS of each of Pastes I-K was about 2.5-4 wt. % (of paste).

Silver particles, in an amount of about 85 wt. % of paste, and an organic vehicle, in an amount of about 11-12.5 wt. % of paste, were added to each of Pastes H-K. Exemplary solar cells were prepared using Wafer 3.

TABLE 18

Composition of IRS in Exemplary Pastes H-K

| Components | Paste H | Paste I | Paste J | Paste K |
|---|---|---|---|---|
| Lead Glass (wt. % IRS) (80 wt. % PbO) | 64.2 | 60.5 | 55.7 | 45.7 |

TABLE 18-continued

Composition of IRS in Exemplary Pastes H-K

| Components | Paste H | Paste I | Paste J | Paste K |
|---|---|---|---|---|
| $TeO_2$ | 20.7 | 19.5 | 18.0 | 14.7 |
| $Ag_2O$ | 15.1 | 8.5 | 13.1 | 10.7 |
| AgI | — | 11.5 | 13.2 | 28.9 |

The paste was screen printed, dried and fired according to the parameters set forth in Example 1. All solar cells were then tested according to the same method as set forth in Example 1. In Table 19, the electrical performance of Pastes I-K is compared to that of Paste H (no AgI) on Wafer 3. Data for Paste H was normalized to 1, and the relevant data for Pastes I-K was calculated by dividing the appropriate measurement by the normalized reference cell data.

TABLE 19

Electrical Performance of Exemplary Pastes H-K on Wafer 3

| | Paste H | Paste I | Paste J | Paste K |
|---|---|---|---|---|
| Eta (%) | 1.000 | 1.100 | 1.075 | 1.082 |
| FF (%) | 1.000 | 1.105 | 1.078 | 1.082 |
| Rs3 (mΩ) | 1.000 | 0.420 | 0.551 | 0.548 |

It is clear from the data presented in Table 19 that Pastes I-K (having AgI) exhibit decreased serial resistance, as shown by the significant reduction of the Rs3 measurement as compared to Paste H. Pastes I-K also exhibited increased solar cell efficiency and fill factor gain compared to Paste H.

EXAMPLE 6

As shown in Table 20, four exemplary electroconductive pastes were prepared (Pastes L-O). Exemplary Pastes L-O were prepared with an IRS comprising varying amounts of the same lead containing glass composition and tellurium oxide composition as used in Example 4, as well as varying amounts of a silver halide. Particularly, Exemplary Pastes L-O comprise silver iodide. The lead containing glass composition was incorporated into the IRS separately from the tellurium oxide and silver halide component. Example 5 was performed in order to ascertain the effect of using less silver iodide than was used in Example 4, and higher amounts of lead containing glass composition. The IRS of each of Pastes L-O was about 2.5-4 wt. % (of paste).

Silver particles, in an amount of about 85 wt. % of paste, and an organic vehicle, in an amount of about 11-12.5 wt. % of paste, were added to each of Pastes L-O. Exemplary solar cells were prepared on Wafer 3.

TABLE 20

Composition of IRS in Exemplary Pastes L-O

| Components | Paste L | Paste M | Paste N | Paste O |
|---|---|---|---|---|
| Lead Glass (wt. % IRS) (80 wt. % PbO) | 69.7 | 71.0 | 73.5 | 75.5 |
| $TeO_2$ | 18.0 | 18.3 | 19.0 | 19.5 |
| $Ag_2O$ | 5.2 | 7.1 | 4.3 | 2.1 |
| AgI | 7.1 | 3.6 | 3.2 | 2.9 |

The paste was screen printed, dried and fired according to the parameters set forth in Example 1. All solar cells were then tested according to the same method as set forth in Example 1. In Table 21, the electrical performance of Pastes L-O is compared to that of Paste I (Example 4, having about 11.5 wt. % AgI) on a 120Ω/☐ silicon wafer. Data for Paste I was normalized to 1, and the relevant data for Pastes L-O was calculated by dividing the appropriate measurement by the normalized reference cell data.

TABLE 21

Electrical Performance of Exemplary Pastes H-K on Wafer 3

| | Paste I | Paste L | Paste M | Paste N | Paste O |
|---|---|---|---|---|---|
| Eta (%) | 1.000 | 1.027 | 0.836 | 1.009 | 1.026 |
| FF (%) | 1.000 | 1.021 | 0.902 | 1.006 | 1.019 |
| Rs3 (mΩ) | 1.000 | 0.849 | 2.703 | 1.070 | 0.849 |

It is clear from the data presented in Table 21 that Paste L, having an AgI content only slightly lower than the AgI content of Paste I, performed best. Paste L exhibited decreased serial resistance, as shown by the significant reduction of the Rs3 measurement as compared to Paste I. Paste O, having a much lower amount of AgI as compared to Paste I, also performed well.

EXAMPLE 7

As shown in Table 22, four exemplary electroconductive pastes were prepared (Pastes P-T). Exemplary Pastes P-T were prepared with an IRS comprising varying amounts of the same lead containing glass composition, tellurium oxide composition, and silver iodide as used in Example 4. In addition, the IRS in Pastes P-T also comprises zinc oxide. The zinc oxide was incorporated into the tellurium oxide/silver iodide component, while the lead glass was incorporated into the IRS separately. The IRS of each of Pastes P-T was about 2.5-4 wt. % (of paste).

Silver particles, in an amount of about 85 wt. % of paste, and an organic vehicle, in an amount of about 11-12.5 wt. % of paste, were added to each of Pastes P-T. Exemplary solar cells were prepared on Wafer 3.

TABLE 22

Composition of IRS in Exemplary Pastes P-T

| Components | Paste P | Paste Q | Paste R | Paste S | Paste T |
|---|---|---|---|---|---|
| Lead Glass (wt. % IRS) (80 wt. % PbO) | 68.3 | 69.7 | 71.9 | 71.0 | 74.3 |
| $TeO_2$ | 18.8 | 19.2 | 19.8 | 19.6 | 20.5 |
| $Ag_2O$ | 2.3 | 4.4 | 2.2 | 2.1 | 1.0 |
| AgI | 7.1 | 3.2 | 2.9 | 2.9 | 1.3 |
| ZnO | 3.4 | 3.5 | 3.2 | 4.4 | 2.9 |

The paste was screen printed, dried and fired according to the parameters set forth in Example 1. All solar cells were then tested according to the same method as set forth in Example 1. In Table 23, the electrical performance of Pastes P-T is compared to that of Paste I (Example 4, having no zinc oxide) on Wafer 3. Data for Paste I was normalized to 1, and the relevant data for Pastes P-T was calculated by dividing the appropriate measurement by the normalized reference cell data.

TABLE 23

Electrical Performance of Exemplary Pastes P-T on Wafer 3

|  | Paste I | Paste P | Paste Q | Paste R | Paste S | Paste T |
|---|---|---|---|---|---|---|
| Eta (%) | 1.000 | 1.018 | 1.021 | 1.019 | 1.014 | 1.020 |
| FF (%) | 1.000 | 1.027 | 1.028 | 1.030 | 1.029 | 1.031 |
| Rs3 (mΩ) | 1.000 | 0.764 | 0.766 | 0.748 | 0.731 | 0.703 |

It is clear from the data presented in Table 23 that all of the exemplary pastes comprising zinc oxide perform better than Paste I (having the same composition, except no zinc oxide). Pastes P-T all exhibited decreased serial resistance, as shown by the significant reduction of the Rs3 measurement as compared to Paste I. Paste P-T also showed increased efficiency and fill factor as compared to Paste I.

EXAMPLE 8

As shown in Table 24, two exemplary electroconductive pastes were prepared (Pastes U-V). Exemplary Pastes U-V were prepared with an IRS comprising varying amounts of lead oxide, tellurium oxide/silver oxide composition, silver iodide, and other additives (SiO2, Al2O3, ZnO, Li2O, P2O5). In this example, all of the components were incorporated directly together into the IRS (as opposed to Examples 4-6). The IRS of each of Pastes U-V was about 2.5-4 wt. % (of paste).

Silver particles, in an amount of about 85 wt. % of paste, and an organic vehicle, in an amount of about 11-12.5 wt. % of paste, were added to each of Pastes U-V. Exemplary solar cells were prepared on Wafer 3.

TABLE 24

Composition of IRS in Exemplary Pastes U-V

| Components | Paste U | Paste V |
|---|---|---|
| TeO$_2$ | 21.5 | 24.3 |
| Ag$_2$O | 3.5 | 3.5 |
| AgI | 4.7 | 4.7 |
| PbO | 48.9 | 46.0 |
| SiO2, Al2O3, ZnO, Li2O, P2O5 (other additives) | 21.3 | 21.5 |

The paste was screen printed, dried and fired according to the parameters set forth in Example 1. All solar cells were then tested according to the same method as set forth in Example 1. In Table 25, the electrical performance of Pastes U-V is compared to that of Paste I (Example 4, wherein lead glass was part of separate matrix forming composition) on Wafer 3. Data for Paste I was normalized to 1, and the relevant data for Pastes U-V was calculated by dividing the appropriate measurement by the normalized reference cell data.

TABLE 25

Electrical Performance of Exemplary Pastes U-V on Wafer 3

|  | Paste I | Paste U | Paste V |
|---|---|---|---|
| Eta (%) | 1.000 | 0.966 | 1.009 |
| FF (%) | 1.000 | 1.025 | 1.038 |
| Rs3 (mΩ) | 1.000 | 0.725 | 0.645 |

It is clear from the data presented in Table 25 that Exemplary Paste V, comprising a higher amount of TeO$_2$ and a lower amount of PbO than Paste U, performed better than Paste I. Pastes U and V both exhibited decreased serial resistance, as shown by the significant reduction of the Rs3 measurement, and increased fill factor, as compared to Paste I. Only Paste V showing increased efficiency as compared to Paste I.

Varying amounts of each IRS component may be used to form an electroconductive paste suitable for the invention. By way of example, and without limiting the invention, the IRS compositions set forth in Table 26 may be used.

TABLE 26

Varying Compositions of Ag—Te—Pb IRS

| Components | X1 | X2 | X3 | X4 | X5 | X6 | X7 | X8 | X9 | X10 | X11 |
|---|---|---|---|---|---|---|---|---|---|---|---|
| TeO$_2$ | 19.4 | 23.5 | 26.0 | 26.0 | 26.0 | 26.0 | 26.0 | 26.0 | 19.6 | 19.6 | 23.4 |
| Ag$_2$O | 1.4 | 1.7 | 1.9 | 1.9 | 1.9 | 1.9 | 1.9 | 1.9 | 2.1 | 2.1 | 2.5 |
| AgI | 4.3 | 5.2 | 5.7 | 5.7 | 5.7 | 5.7 | 5.7 | 5.7 | 2.9 | 2.9 | 3.4 |
| PbO | 50.5 | 46.1 | 43.2 | 42.8 | 42.6 | 43.8 | 43.2 | 43.2 | 50.7 | 50.7 | 46.7 |
| SiO2, Al2O3, ZnO, Li2O, P2O5, B2O3 | 24.4 | 23.5 | 23.1 | 23.5 | 23.8 | 22.5 | 23.2 | 23.2 | 24.7 | 24.7 | 24.0 |

EXAMPLE 9

As shown in Table 27, four exemplary electroconductive pastes were prepared (Pastes S1-S4), all containing the exact same IRS as in Paste S (Example 6). The pastes differ in that they contain differing amounts of IRS, and different amounts and types of organic vehicle (Vehicle 1 and Vehicle 2), and Paste S2 contains two types of silver particles (Silver 1 and Silver 2). Exemplary solar cells were prepared on Wafer 3.

TABLE 27

Composition of Exemplary Pastes S1-S4

| Components | Paste S1 | Paste S2 | Paste S3 | Paste S4 |
|---|---|---|---|---|
| IRS (wt. % paste) | 3.7 | 3.7 | 3.4 | 3.4 |
| Silver 1 (wt. % paste) | 87 | 43.5 | 87 | 87 |
| Silver 2 (wt. % paste) |  | 43.5 |  |  |
| Vehicle 1 (wt. % paste) | 9.3 |  |  | 9.6 |
| Vehicle 2 (wt. % paste) |  | 9.3 | 9.6 |  |

The paste was screen printed, dried and fired according to the parameters set forth in Example 1. All solar cells were then tested according to the same method as set forth in Example 1. In Table 28, the electrical performance of Pastes S1-S4 is compared to Paste S. Data for Paste S was normalized to 1, and the relevant data for Pastes S1-S4 was calculated by dividing the appropriate measurement by the normalized reference cell data.

TABLE 28

Electrical Performance of Exemplary Pastes S1-S4 on Wafer 3

|         | Paste S | Paste S1 | Paste S2 | Paste S3 | Paste S4 |
|---------|---------|----------|----------|----------|----------|
| Eta (%) | 1.00    | 1.00     | 0.92     | 0.98     | 1.00     |
| FF (%)  | 1.00    | 0.97     | 0.90     | 0.95     | 0.98     |
| Rs3 (mΩ)| 1.00    | 1.15     | 1.74     | 1.32     | 1.10     |

It is clear from the data presented in Table 28 that Exemplary Paste S4, comprising about 3.4 wt. % (of paste) of IRS performed better than the other Exemplary Pastes S1-S3. With respect to Paste S, it had comparable efficiency and fill factor, while having only slightly higher series resistance.

EXAMPLE 10

Glass samples comprising silver iodine ("G1 and "G2") as presented in Table 29 were prepared.

TABLE 29

Sample Silver Iodine Glass Compositions

|                | G1   | G2   |
|----------------|------|------|
| $TeO_2$ (%)    | 49.4 | 27.1 |
| $AgO_{0.5}$ (%)| 21.5 | 19.7 |
| AgI (%)        | 29.1 | 53.2 |

Glasses G1 and G2 were melted on top of alumina plates and let cool forming a glass layer. The thickness of the glass layer varied between about 50-200 μm across the entire surface. An HP 43301A multimeter probe was used to measure the electrical resistance of glasses G1 and G2 across a gap distance of approximately 1 mm. Both G1 and G2 glasses are conductive. Across the gap, G1 measured a resistance of about $1.0 \times 10^7 \Omega$, while G2 measured a resistance of about $1.5 \times 10^6 \Omega$.

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

What is claimed:

1. An electroconductive paste composition comprising:
   metallic particles;
   an inorganic reaction system comprising (i) a silver containing matrix forming composition comprising silver-tellurium-zinc oxide, and (ii) a lead containing matrix forming composition; and
   an organic vehicle.

2. The electroconductive paste composition according to claim 1, wherein the inorganic reaction system has a conductivity of greater than $1 \times 10^{-12} S \cdot cm^{-1}$.

3. The electroconductive paste composition according to claim 1, wherein the silver containing matrix forming composition further comprises silver oxide or silver halide.

4. The electroconductive paste composition according to claim 1, wherein the lead containing matrix forming composition comprises a lead containing glass composition.

5. The electroconductive paste composition according to claim 1, further comprising an additional matrix forming composition that is free of intentionally added lead.

6. The electroconductive paste composition according to claim 1, wherein the silver containing matrix forming composition comprises silver up to 85 mol. %, based upon 100 mol % of silver containing matrix forming composition.

7. The electroconductive paste composition according to claim 6, wherein the silver containing matrix forming composition comprises silver between 20-85 mol. %, based upon 100 mol % of silver containing matrix forming composition.

8. The electroconductive paste composition according to claim 1, wherein the silver containing matrix forming composition comprises up to 80 wt. % of silver, based upon 100 wt % of silver containing matrix forming composition.

9. An electroconductive paste composition comprising:
   metallic particles;
   an inorganic reaction system comprising:
     a silver halide matrix forming composition according to
       $(AgHA)_x$-$(AgO_{0.5})_y$-$(M_nO_r)_z$
       wherein HA is Br, I, Cl. or F;
       M is selected from the group consisting of Pb, Bi, Li, Na, K, Mg, Sr, Ba, Zn, P, B, Si, Ag, Al, Ti, W, V, Cr, Mn, Co, Ni, Cu, Nb, Ta, M, Th, Ge, Mo, La and Ce;
       $n>0$, and $O_r$ charge balances $M_n$;
       $0 \leq x, y,$ or $z \leq 1$; and
     a lead containing matrix forming composition; and
   an organic vehicle.

10. The electroconductive paste composition of claim 9, wherein x:y is 0:100 to 95:5, and x:z is 0:100 to 95:5.

11. The electroconductive paste composition of claim 10. wherein x:y is 0:100 to 75:25 and x:z is 0:100 to 80:20.

12. The electroconductive paste composition of claim 9, wherein HA is Br or I.

13. The electroconductive paste composition of claim 9, wherein M is at least one selected from the group consisting of Te, Pb, P, Zn, and B.

14. The electroconductive paste composition of claim 9, wherein the silver halide matrix forming composition comprises about 0.5-95 wt. % of silver halide, about 0.5-60 wt. % of $Ag_2O$ and about 0.5-95 wt. % other oxides, based upon 100% total weight of the silver halide matrix forming composition.

15. The electroconductive paste composition of claim 9, wherein the silver halide matrix forming composition further comprises at least one selected from the group consisting of alkaline oxides, alkaline earth metal oxides, rare earth metal oxides, and Pb, Bi, Al, Ga, Si, Ge, Sn, B, P, Sb, Te, Nb, Ta, V, Ti, Mo, or W oxides.

16. The electroconductive paste composition of claim 9, wherein the inorganic reaction system is about 1-15 wt. % of total electroconductive paste.

17. The electroconductive paste composition of claim 9, wherein the silver halide matrix forming composition comprises about 5-95 wt. %, based upon 100% total weight of the inorganic reaction system.

18. The electroconductive paste composition of claim 9, wherein the metallic particles are at least one selected from the group consisting of silver, gold, copper, and nickel.

19. The electroconductive paste composition of claim 9, wherein the metallic particles are silver.

20. The electroconductive paste composition of claim 9, wherein the metallic particles are about 50-95 wt. % of paste.

21. The electroconductive paste composition of claim 9, wherein the organic vehicle comprises a binder, a surfactant, an organic solvent, and a thixotropic agent.

22. The electroconductive paste composition of claim 9, wherein the organic vehicle is about 1-20 wt. % of electroconductive paste.

* * * * *